United States Patent
Weyers et al.

(10) Patent No.: US 9,768,160 B2
(45) Date of Patent: Sep. 19, 2017

(54) SEMICONDUCTOR DEVICE, ELECTRONIC CIRCUIT AND METHOD FOR SWITCHING HIGH VOLTAGES

(71) Applicant: Infineon Technologies Austria AG, Villach (AT)

(72) Inventors: Joachim Weyers, Hoehenkirchen (DE); Franz Hirler, Isen (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 499 days.

(21) Appl. No.: 14/454,299

(22) Filed: Aug. 7, 2014

(65) Prior Publication Data

US 2015/0042177 A1    Feb. 12, 2015

Related U.S. Application Data

(63) Continuation-in-part of application No. 13/963,383, filed on Aug. 9, 2013, now Pat. No. 8,958,189.

(51) Int. Cl.

| | |
|---|---|
| *H02H 9/04* | (2006.01) |
| *H01L 27/06* | (2006.01) |
| *H01L 29/417* | (2006.01) |
| *H01L 29/40* | (2006.01) |
| *H01L 29/78* | (2006.01) |
| *H01L 29/739* | (2006.01) |
| *H01L 29/861* | (2006.01) |
| *H01L 29/866* | (2006.01) |
| *H01L 29/06* | (2006.01) |

(52) U.S. Cl.
CPC ........ *H01L 27/0629* (2013.01); *H01L 29/407* (2013.01); *H01L 29/41725* (2013.01); *H01L 29/7397* (2013.01); *H01L 29/7802* (2013.01); *H01L 29/7803* (2013.01); *H01L 29/7804* (2013.01); *H01L 29/7808* (2013.01); *H01L 29/7809* (2013.01); *H01L 29/7811* (2013.01); *H01L 29/7813* (2013.01); *H01L 29/0623* (2013.01); *H01L 29/866* (2013.01); *H01L 29/8611* (2013.01); *Y10T 307/76* (2015.04)

(58) Field of Classification Search
CPC ............. H02H 3/20; H02H 9/04; H02H 9/041
USPC ...................................... 361/91.5
See application file for complete search history.

(56) References Cited

U.S. PATENT DOCUMENTS

| | | |
|---|---|---|
| 6,344,958 B1 | 2/2002 | Morrill |
| 6,392,859 B1* | 5/2002 | Ohshima ............ H01L 27/0248 |
| | | 257/E27.112 |
| 7,268,992 B2 | 9/2007 | Hallak et al. |
| 7,602,595 B2 | 10/2009 | Hiyama |

(Continued)

*Primary Examiner* — Dharti Patel
(74) *Attorney, Agent, or Firm* — Murphy, Bilak & Homiller, PLLC

(57) ABSTRACT

Disclosed is a semiconductor device, an electronic circuit, and a method. The semiconductor device includes a semiconductor body; at least one transistor cell including a source region, a drift region, a body region separating the source region from the drift region, and a drain region in the semiconductor body, and a gate electrode dielectrically insulated from the body region by a gate dielectric; a source node connected to the source region and the body region; a contact node spaced apart from the body region and the drain region and electrically connected to the drain region; and a rectifier element formed between the contact node and the source node.

11 Claims, 13 Drawing Sheets

(56) References Cited

U.S. PATENT DOCUMENTS

| | | |
|---|---|---|
| 7,760,479 B2 | 7/2010 | Garrett |
| 8,068,322 B2 | 11/2011 | Bingel et al. |
| 2004/0094819 A1 | 5/2004 | Saitoh et al. |

* cited by examiner

SEMICONDUCTOR DEVICE, ELECTRONIC CIRCUIT AND METHOD FOR SWITCHING HIGH VOLTAGES

TECHNICAL FIELD

Embodiments described herein relate to a semiconductor device, and an electronic circuit. Furthermore, embodiments described herein relate to methods for switching high voltages.

BACKGROUND

Switched mode power supplies (SMPS) are widely used for supplying electronic loads to devices such as computers, television sets or any other electronic appliances with a suitable voltage level out of a mains voltage in the range of typically e.g. 90V to 240V rms. Transformers in many cases galvanically decouple the load from the mains and provide the appropriate voltage level at the secondary side consume less space and are more economic if designed for higher frequencies, above the frequency range from 50 Hz to 60 Hz of most AC mains. Electronic switches, e.g. high-voltage MOSFETs or IGBTs are commonly used for providing a primary side of the transformer with appropriate high frequency voltage and current waveforms out of a direct current (DC) link which can be generated by rectifying the mains voltage. It is noted here that the use of such electronic switches is not restricted to the applications mentioned above.

In an electronic switch connected to the primary side of the transformer, when driving the primary side of the transformer with high voltage, high frequency and high current signals, both ohmic losses and switching losses occur. These losses are present when turning-on and especially when turning-off the electronic switch. To reduce the switching losses and at the same time increase an overall efficiency, a number of configurations and methods for driving the transformer have been established. These methods include an operation of a resonant tank wherein the electronic switches mainly are turned-on and/or turned-off close to or at zero crossing of the voltage. Thereby, switching losses can be reduced. Such methods are often referred to as soft switching of the electronic switches. In normal operation, the maximum voltage that is applied to the load terminals during soft switching is the voltage of the DC link. Situations may occur, however, where soft switching conditions are not achieved, e.g. during power-up of the SMPS, load jumps, etc. In these cases, the electronic switch cannot necessarily turn-off close to zero voltage or zero current but at a significant current and/or voltage at the terminals of the electronic switch. In these cases a significant voltage overshoot can occur which exceeds the DC link voltage.

Therefore, conventionally used electronic switches provide a blocking capability which is exceeding the voltage of the DC link. A charge stored between the load terminals of the high-voltage electronic switch, however, increases with increasing blocking requirements of the device. This can adversely affect both the switching losses of the high-voltage electronic switch and the control stability of the SMPS.

The on-state losses of a high-voltage electronic switch having a given chip area can significantly increase with increasing blocking requirements. On the one hand, a width of a drift zone sustaining the voltage across the load terminals will linearly increase with the blocking capability, according to a first order approximation. Furthermore, a reduction of a net doping of the drift zone can be provided in order to improve the blocking capability. As a result, the on-state losses of a high-voltage electronic switch can increase significantly with increasing blocking capability, e.g. the on-state losses of the high-voltage electronic switch can increase disproportionally high with increasing blocking capability.

In view of the above, there is a need for improvement.

SUMMARY

One embodiment relates to a semiconductor device. The semiconductor device includes a semiconductor body, at least one transistor cell having a source region, a drift region, a body region separating the source region from the drift region, and a drain region in the semiconductor body, and a gate electrode dielectrically insulated from the body region by a gate dielectric. The semiconductor device further includes a source node connected to the source region and the body region, a contact node spaced apart from the body region and the drain region and electrically connected to the drain region, and a rectifier element formed between the contact node and the source node.

One embodiment relates to an electronic circuit. The electronic circuit includes a first semiconductor device having a load path between a source node and a drain node, a control node, and an internal rectifier element formed between a contact node and a source node, wherein the contact node is spaced apart from a drain region and a body region in a semiconductor body of the first semiconductor device. The electronic circuit further includes a second semiconductor device comprising a load path between a drain node and a source node and a control node, wherein the first semiconductor device and the second semiconductor device have their load paths connected in series and wherein the control node of the second semiconductor device is coupled to the source node of the first semiconductor device.

One embodiment relates to an electronic circuit. The electronic circuit includes a first field-effect transistor having a source node, a drain node and a gate node. The first field-effect transistor is a normally-off transistor. The electronic circuit further includes a second field-effect transistor having a source node, a drain node and a gate node and connected in series with the first field-effect transistor, wherein the second field-effect transistor is a normally-on transistor. A control unit is connected to the drain node of the first field-effect transistor and to the gate node of the second field-effect transistor and being operable to block the second field-effect transistor if a voltage level of a voltage between the drain node and the source node of the first field-effect transistor exceeds a high-voltage level.

One embodiment relates to a semiconductor device including a cell region, an edge surface, and an edge termination region arranged between the edge surface and the cell region. The semiconductor device further includes a first field-effect transistor with a source node, a drain node and a gate node, and a Zener diode and a resistor connected in series between the drain node and the source node of the first field-effect transistor. The Zener diode and the resistor are monolithically integrated in the edge termination region of the semiconductor device. The semiconductor device further includes a second field-effect transistor having a source node, a drain node and a gate node. The source node of the second field-effect transistor is connected to the drain node of the first field-effect transistor, and a circuit node common to the Zener diode and the resistor is coupled to the gate node of the second field-effect transistor.

One embodiment relates to a method. The method includes providing a series circuit with a first transistor comprising a source node, a drain node, and gate node, and a second transistor comprising a source node, a drain node, and gate node, wherein the source node of the second transistor is coupled to the drain node of the first transistor. The method further includes applying a voltage between the drain node of the second transistor and the source node of the first transistor, operating the series circuit in a normal mode in which the first transistor switches on and off based on a signal received at the gate node, and the second transistor switches on, if a voltage at the drain node of the first transistor is below a predefined voltage level, and operating the series circuit in a protection mode in which the first transistor switches off based on a signal received at the gate node, and the second transistor switches off if a voltage at the drain node of the first transistor is above the predefined voltage level.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead the figures illustrate principles of embodiments of the invention. Moreover, in the figures, like reference numerals designate corresponding parts.

DETAILED DESCRIPTION

Figure 1:
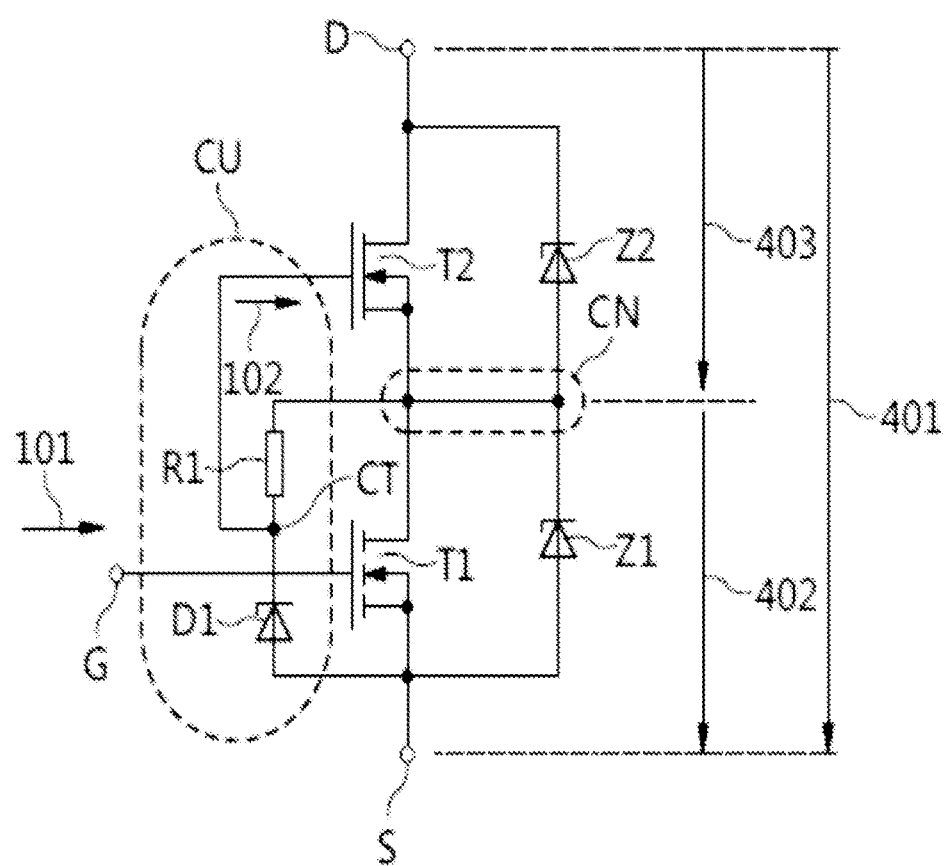
FIG. 1 illustrates a cascode circuit including a first semiconductor device implemented as field-effect transistor and a second semiconductor device implemented as a field-effect transistor connected to a control unit, according to an embodiment.

In the following Detailed Description, reference is made to the accompanying drawings, which form a part hereof, and in which are shown by way of illustration specific embodiments in which the invention can be practiced. In this regard, directional terminology, such as "top," "bottom," "front," "back," leading," "trailing," lateral, vertical, etc., is used with reference to the orientation of the Figure(s) being described. Because components of embodiments can be positioned in a number of different orientations, the directional terminology is used for purpose of illustration and is in no way limiting. It is to be understood that other embodiments can be utilized and structural or logical changes can be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

In the drawings the lateral direction is denoted by a reference numeral x. Moreover, in the drawings the vertical direction is denoted by a reference numeral y.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

In the context of the present specification, the term "MOS" (metal-oxide-semiconductor) should be understood as including the more general term "MIS" (Metal-Insulator-Semiconductor). For example, the term MOSFET (Metal-Oxide-Semiconductor field-effect transistor) should be understood to include FETs having a gate insulator that is not an oxide, i.e. the term MOSFET is used in the more general term meaning of IGFET (Insulated-Gate Field-Effect Transistor) and MISFET (Metal-Insulator-Semiconductor Field-Effect Transistor), respectively. The term "metal" for the gate material of the MOSFET should be understood to include electrically conductive materials such as, but not restricted to, metal, alloys, doped polycrystalline semiconductors and metal semiconductor compounds such as metal silicides.

Field-effect controlled switching devices such as MOSFETs or IGBTs have been used for various applications, including use as switches in power supplies and power converters, electric cars, air-conditioners, and even stereo systems. Particularly with regard to power devices capable of switching large currents and/or operating at higher voltages, a low resistance in the conducting on-state is often desired. This means e.g. that, for a given current to be switched, the voltage drop across the switched on FET, i.e., the source-drain voltage is desired to be low. On the other hand, the losses occurring during switching off or commutating of the FET are often also to be kept small to minimize the overall losses.

The term "semiconductor power switch" as used in this specification describes a semiconductor device on a single chip with high voltage and/or high current switching capabilities. In other words, power semiconductor devices are intended for high current, typically in the Ampere range. Within this specification the terms "semiconductor power switch", "solid-state switching device" and "power semiconductor device" are used synonymously.

In the context of the present specification, a semiconductor region in which an inversion channel can be formed and/or controlled by field-effect is also referred to as body region.

The term "field-effect" as used in this specification describes the effect of capacitively generating a "conducting channel" and/or control of conductivity and/or shape of the conducting channel in a semiconductor region by applying an electrical potential to an electrode (gate electrode) dielectrically insulated from the semiconductor region by a dielectric layer (gate dielectric). The conducting channel may be an inversion channel or an accumulation channel.

In the context of the present specification, the term "field-effect structure" describes a structure which is formed in a semiconductor substrate or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$).

In the context of the present specification, the term "gate electrode" describes an electrode which is located next to, and insulated from the body region and configured to form and/or control a channel region through the body region. The terms "electrical connection" and "electrically connected" describes an ohmic connection between two elements.

In the context of the present specification, the term "Zener diode" describes a diode limiting the blocking voltage across its anode and cathode electrode by generating a current flow either by avalanche multiplication or by tunnelling. Thereby, the term "Zener diode" as used herein is used as a synonym, e.g. for "avalanche diode" or "Tunnel diode" or the like. "Zener voltage" in this context intends to describe the voltage limited by a Zener diode or a breakdown voltage of the Zener diode according to the definition above.

As used herein, the term "voltage-limiting element" describes an electronic component capable of limiting a voltage applied across two of its terminals, to a specified voltage level. Examples of such voltage-limiting elements are Zener diodes described herein above.

In this specification, n-doped is referred to as first conductivity type while p-doped is referred to as second conductivity type. Alternatively, the semiconductor devices can be formed with opposite doping types so that the first conductivity type can be p-doped and the second conductivity type can be n-doped. Furthermore, some figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

The terms "electrical connection" and "electrically connected" describes an ohmic connection between two elements.

As used herein, the term "cascode circuit" is intended to be representative of a circuit configuration wherein two transistors are connected in series, and wherein the gate terminal of one of the two transistors can be used as a control terminal for switching through a conduction path represented by the series connection of the two transistors.

A compensation circuit element having a charge compensation structure with alternating n-doped columns and p-doped columns in the drift region such as an enhancement mode field-effect transistor having a superjunction structure (SJ FET) operates with a high value of output charge. This fact results from a high doping of n-regions which carry a load current of the transistor and a high doping of p-regions substantially matching the doping of the n-regions when integrating the amount of n- and p-doping atoms in the drift region, respectively, and substantially carrying no current when the device is switched on. High n-doping results in a lower charge carrier mobility. The lower charge carrier mobility can be compensated by a larger amount of charge carriers which are removed when the device is switched off. During turning-off, charge carriers stored in the device are removed to bring the device into the blocking state. Thus, a non-conducting space-charge region can be obtained. The amount of charge carriers which are removed for switching off the device results in an output charge herein denoted by Qoss. The output charge Qoss exhibits a substantially linear dependence from a chip area.

In the design of high-voltage switching devices it is desired to provide a high voltage blocking capability and a low on-resistance (Ron). Power semiconductor devices can include a drift region arranged between a body region and a drain region. The on-resistance of such kind of high-voltage semiconductor switching device increases as the length of a current path through the drift region increases and as a doping concentration in the drift region decreases. In order to obtain a low on-resistance (Ron), n regions in the SJ FET can be highly doped, wherein at the same time a width of the n columns can be reduced. A reduction of the widths of both n columns and p columns in the drift region results in a reduced pitch of the compensation circuit element. Thereby, a product of the on-resistance and the output charge Ron× Qoss representing a characteristic value of the compensation circuit element is increased.

On the other hand, the high-voltage blocking capability decreases with a decreasing length of the drift region and an increasing doping concentration in the drift region. For superjunction structures, this holds true not for e.g. the n-doping alone but for a mean overall doping, i.e. the mathematically integrated difference of the n-doping and the p-doping in the drift region that is typically lower than the maximum or mean doping concentration of the n-doping alone. Since the mean overall doping must not exceed a certain limit and is depending on the accuracy by which the n- and p-doping can be adjusted, there is a trade-off between a low on-resistance and a high-voltage blocking capability of a compensation circuit element. An area-specific output charge, i.e. an output charge related to an element area A (chip area) exhibits a substantially linear dependence from an active thickness of the circuit element, and thus, from the blocking voltage. As an example, a compensation circuit element providing a blocking voltage capability of 600 V operates with an output charge Qoss which is increased by 20% as compared to a similar dimensioned compensation circuit element providing a blocking voltage capability of 500 V. Thereby, if a reduction of the blocking voltage capability can be achieved, output charge can be reduced.

Moreover, an area specific on-resistance, i.e. a resistance related to the chip area A, increases with increasing blocking voltage Vb approximately according to the following equation:

$$Ron \sim Vb^{2.5}. \qquad (1)$$

Thus, a reduction in permissible blocking voltage Vb can reduce the on-resistance Ron to a large extent. In other words, e.g., if a compensation circuit element #1 having a blocking voltage capability of 400 V is compared to a compensation circuit element #2 having a blocking voltage capability of 600 V, and if both compensation circuit elements provide the same on-resistance Ron, then the compensation circuit element #2 only takes up 36% of the chip area as compared to the compensation circuit element #1. In addition, the output charge Qoss of the compensation circuit element #2 is reduced as compared to the compensation circuit element #1. The relation for the on-resistance according to equation (1) is an approximation and is valid for the same type of technology, i.e. if two superjunction technologies for the two voltage classes are compared, then the area specific on-resistances are governed by equation (1) if same accuracy limits of the compensation between n- and p-doping are considered.

With reference to FIG. 1, a first embodiment of a high-voltage semiconductor switch 100 is described. Referring to FIG. 1, the high-voltage semiconductor switch 100 includes a cascode circuit with a first semiconductor device T1 and a second semiconductor device T2. Each of these first and second semiconductor devices T1, T2 includes a load path between a first load node and a second load node, and a control node. A control unit CU is coupled to the control node of the second semiconductor device T2. This control unit CU is configured to control operation of the second semiconductor device T2 based on an operation mode of the first semiconductor device T1.

In the embodiment shown in FIG. 1, each of the first and second semiconductor devices T1, T2 is implemented as a field-effect transistor which includes a gate (node) as a control node, a source (node) as the first load node, and a drain (node) as the second load node. The first semiconductor device T1 will also be referred to as first field-effect transistor T1 in the following, and the second semiconductor device T2 will also be referred to as second field-effect transistor in the following. The second field-effect transistor T2 is adapted to protect the first field-effect transistor T1 against overvoltage. According to one embodiment, the voltage blocking capability of the second field-effect transistor T2 is lower than the voltage blocking capability of the first field-effect transistor T1. According to another embodiment, the voltage blocking capability of the second field-effect transistor T2 is approximately the same as the voltage blocking capability of the first field-effect transistor T1.

The first field-effect transistor T1 has its load path connected in series to the load path of the second field-effect transistor T2. For this, the drain of the first field-effect transistor T1 is connected to the source of the second field-effect transistor T2 at a common node CN. A drain-source voltage of the first transistor T1, which is a voltage between the drain node and the source node, is denoted by reference numeral 402, and a drain-source voltage of the second transistor T2 is denoted by a reference numeral 403. An overall voltage of the high-voltage semiconductor switch 100 is represented by a reference numeral 401. This overall voltage 401 corresponds to voltage 402 plus voltage 403 and is the voltage between a first terminal (first node), i.e. the source S of the first field-effect transistor T1, and a second terminal (second node), i.e. the drain D of the second field-effect transistor T2.

The control unit CU is connected to the drain of the first field-effect transistor T1, and thus to the common node CN, and to the gate of the second field-effect transistor T2. The control unit is adapted to block the second field-effect transistor T2 if the drain-source voltage 402 across the first field-effect transistor T1 exceeds a rated high-voltage level.

According to one embodiment, in the cascode circuit shown in FIG. 1, the first field-effect transistor T1 is implemented as a compensation circuit element, and the second field-effect transistor T2 is implemented as a self-conducting circuit element. In other words, the first field-effect transistor T1 can be implemented as a normally-off (enhancement mode) transistor, and the second field-effect transistor T2 can be implemented as a normally-on (depletion mode) transistor.

Referring to FIG. 1, a first voltage-limiting element such as, e.g., a first Zener diode Z1 is connected in parallel with the source-drain path of the first field-effect transistor T1, whereas a second voltage-limiting element such as, e.g., a second Zener diode Z2 is connected in parallel with the source-drain path of the second field-effect transistor T2. The two Zener diodes Z1 and Z2 serve to limit the voltage levels of the voltages 402, 403 across the load paths of the first and second transistor T1, T2. Each of the Zener diodes Z1 and Z2 can be integrated in the same semiconductor chip (semiconductor body) as the transistor T1, T2 it is coupled in parallel thereto. The Zener diodes Z1, Z2 are optional. According to one embodiment the Zener diodes Z1, Z2 are omitted so that the first and second transistors may undergo a voltage breakdown when the voltage level of the respective load path voltage reaches the respective voltage blocking capability. According to one embodiment the functionality of the Zener (tunneling) effect of the Zener diodes Z1 and/or Z2 can be replaced or complemented by an effect comprising avalanche carrier multiplication and punching of an electric field leading to a current flow when a certain blocking voltage between the cathode and the anode of the Zener diode is exceeded.

As shown in FIG. 1, the control unit CU includes a voltage-limiting element such as a Zener diode D1 and a resistor R1 connected in series between the drain and the source of the first field-effect transistor T1. A circuit node CT common to the Zener diode D1 and the resistor R1 is connected to the gate of the second field-effect transistor T2. If a voltage level of the voltage 402 across the first field-effect transistor T1, i.e. the drain-source voltage of the first field-effect transistor T1, exceeds a predetermined voltage level, then the Zener diode D1 clamps the electrical potential at the circuit node CT to a level which corresponds to the electrical potential at the source node of the first transistor device T1 plus a Zener voltage (breakdown voltage) of the Zener diode D1. At the circuit node CT, the resistor R1 and the cathode terminal of the Zener diode D1 are connected. The electrical potential at the gate of the second field-effect transistor T2 connected in series to the first field-effect transistors T1 substantially corresponds to the electrical potential at the circuit node CT. When the voltage 402 rises above the Zener voltage of the Zener diode D1, the Zener diode D1 keeps (clamps) the electrical potential at the gate of the second transistor T2 at the Zener voltage, while the voltage 402 may further increase. According to one embodiment the functionality of the Zener (tunneling) effect of the Zener diode D1 can be replaced or complemented by an effect comprising avalanche carrier multiplication and punching of an electric field leading to a current flow when a certain blocking voltage across between the cathode and the anode of the Zener diode D1 is exceeded.

In a normal operation or switching mode, the source S of the first field-effect transistor T1 is connected to negative potential or ground, wherein the drain of the second field-effect transistor T2 is connected to a positive voltage to be switched. As the second field-effect transistor T2 is implemented as an n-type depletion transistor, it switches to its off-state if the potential applied at its gate terminal is negative with respect to the potential applied at its source terminal, that is, when the gate-source voltage of the second transistor T2 becomes more negative than a threshold value.

According to one embodiment, the second field-effect transistor T2 is implemented as one of an n-channel MOSFET, a JFET, and a HEMT. The first field-effect transistor T1 can be selected from the group consisting of an n-channel MOSFET, an IGBT, a JFET, and a HEMT. The MOSFETs for use as the first and/or second field-effect transistor T1 and/or T2 can be designed as superjunction transistors according to an embodiment.

The cascode circuit shown in FIG. 1 can be operated in one of a normal operation mode, and a protection mode. In the normal operation mode, only the first field-effect transistor T1 switches on and off controlled by a switching signal 101 applied at its gate, while the second transistor T2 is permanently in the on-state. The cascode circuit is in the normal operation mode as long as a voltage level of the voltage 402 is below the Zener voltage of the Zener diode D1. This voltage level will be referred to as rated or predetermined voltage level in the following. As an example, the rated voltage level is +390 V with respect to ground, i.e. with respect to the source potential of the first field-effect transistor T1. Thus, due to the voltage-limiting property of the Zener diode D1, a voltage level at the gate of the second field-effect transistor T2 is clamped at +390 V, whereas at the drain of the transistor T2 there may a voltage level exceeding the rated voltage level. When the voltage 402 rises above the rated voltage, the cascode circuit operates in the protection mode. In this operation mode, the second transistor T2 starts to switch off, thereby increasing its on-resistance, and thereby protecting the first transistor T1.

The overall voltage 401 is the voltage between the drain D of the second field-effect transistor T2 and the source S of the first field-effect transistor T2, and will be referred to as drain-source voltage in the following. The source of the second field-effect transistor T2 and the drain of the first field-effect transistor T1 are electrically connected to the common node CN. If, in the protection mode, the drain-source voltage 401 and, consequently the voltage 402 across the first transistor T1 falls below the rated voltage level the negatively charged gate of the second field-effect transistor T2 is discharged via the resistor R1. Then, the second field-effect transistor T2 again transits to its normally-on state and the normal operation mode is resumed.

In other words, the method of protecting the high-voltage enhancement mode switching transistor T1 against overvoltage can include providing a series connection of the enhancement mode field-effect transistor T1 and the depletion mode field-effect transistor T2 by connecting the source of the depletion mode field-effect transistor T2 to the drain of the enhancement mode field-effect transistor T1, wherein the high voltage 401 is applied between the drain D of the depletion mode field-effect transistor T2 and the source S of the enhancement mode field-effect transistor T1.

Switching the high voltage, in a normal operation mode, includes applying a switching signal 101 at the gate G of the enhancement mode field-effect transistor T1. If an overvoltage is detected at the drain of the enhancement mode field-effect transistor T1, i.e. at the common node CN, switching from the normal operation mode to a protection mode is performed. In the protection mode, the depletion mode field-effect transistor is switched off or starts to switch off. Thereby, the control unit CU can provide a transition from the normal operation mode where the applied high voltage is switched, to the protection mode where the high-voltage switching operation is blocked. On the basis of the drain-source voltage of the first field-effect transistor T1 the control unit CU generates a control signal 102 for the gate of the second field-effect transistor T2.

As an example, the first field-effect transistor T1 can have an area-specific on-resistance of Ron×A=400 mΩ×mm$^2$ and a blocking voltage capability of 400 V, and the second field-effect transistor T2 can have an area-specific on-resistance of Ron×A=260 mΩ×mm$^2$ and a blocking voltage capability of 200 V. Furthermore, the second field-effect transistor T2 according the above example can take up 80% of the chip area of the first field-effect transistor T1. Then, a total blocking voltage capability of 600 V can be achieved by means of the series connection of the two field-effect transistors T1 and T2, respectively. As compared to a conventional power semiconductor switching transistor having, e.g. an area-specific on-resistance of Ron×A=1000 mΩ×mm$^2$ and a blocking voltage capability of 600 V, the series connection of the two field-effect transistors T1 and T2 according to FIG. 1 can provide an output charge Qoss which only amounts to 50% of the output charge present in the conventional power semiconductor switching transistor.

Figure 2:
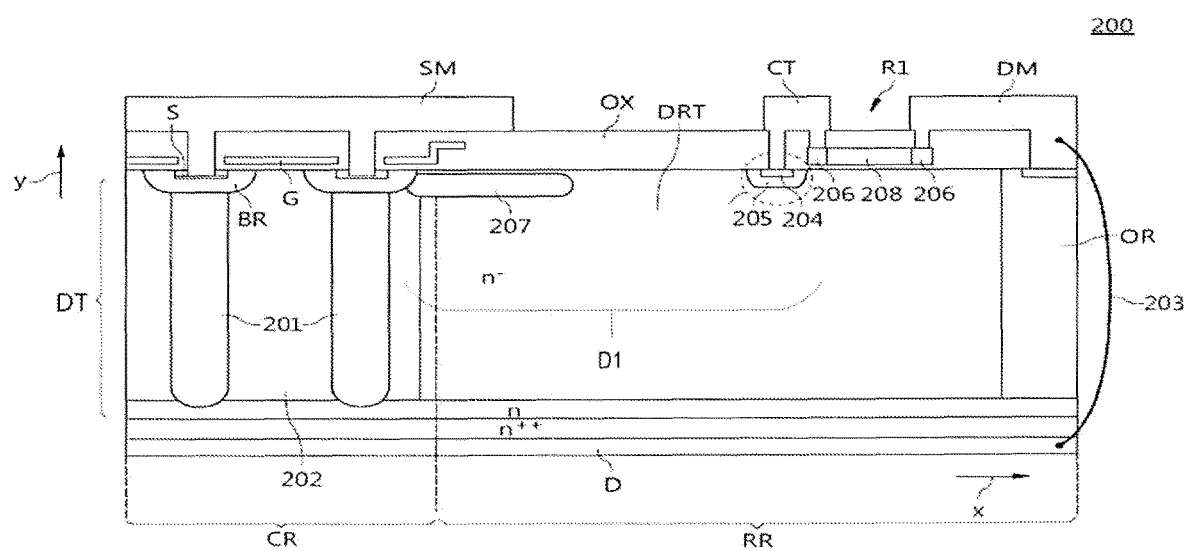
FIG. 2 illustrates a cross section of the first semiconductor device, according to an embodiment.

FIG. 2 illustrates a cross section of an integrated semiconductor device 200, according to an embodiment. In the cross section of FIG. 2, x denotes a lateral direction of a semiconductor body (semiconductor substrate) of the device 200, and y denotes a vertical direction of the semiconductor body. Thereby, the x-direction as used in this specification describes an orientation substantially parallel to the main surface of the semiconductor substrate, whereas the y-direction describes an orientation, which is substantially perpendicular to the main surface of the semiconductor substrate.

As shown in FIG. 2, the semiconductor body of the integrated semiconductor device 200 includes a cell region CR, an edge surface (outer rim) OR, and an edge termination region RR (rim region) between the edge surface OR and the cell region CR. The cell region CR includes a drift region DT. The drift region DT may include a superjunction structure with p-doped columns 201 and n-doped columns 202 arranged alternatingly. The cell region CR further includes transistor cells, each including a source region S, a body region BR separating the source region S from the drift region DT, and a gate electrode G. The gate electrode G is dielectrically insulated from the body region BR by a gate dielectric and is configured to control an inversion channel in the body region BR. The edge termination region RR includes a drift region termination DRT. In the drift region termination DRT of the edge termination region RR (rim region) a structure of alternating p-doped columns and n-doped columns can be provided as well, although not shown in FIG. 2. FIG. 2 shows the drift region termination DRT of the edge termination region RR with a low doping concentration. The semiconductor device 200 shown in FIG. 2 includes a drain D region that may be implemented as a highly doped substrate and a number of epitaxial layers n++, n, and n− forming the drift regions, i.e. the drift region DT in the cell region CR, and the drift region termination DRT in the edge termination region RR, respectively. The source regions S and body regions BR of the individual transistor cells are connected to a source metallization SM adapted to be connected to external circuit components. The gate electrode G is embedded in a dielectric layer, e.g. an oxide layer OX, which, in the region between the gate electrode G and the body region BR forms the gate dielectric. The dielectric layer OX can include silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$), or any combinations thereof.

Referring to FIG. 2, a lateral p-doped junction termination extension region 207 extends from the last p-column 201 and/or the last body region BR of the cell region CR and further laterally extends into the edge termination region RR. This lateral p-doped junction termination extension region 207 is optional. According to one embodiment, the Zener diode D1 is monolithically integrated in the semiconductor body of the semiconductor device 200. In particular, the Zener diode D1 may be integrated in the cell region CR and a part of the edge termination region RR.s In the embodiment shown in FIG. 2, the Zener diode D1 includes an n-well region 205 in the edge region RR, at least one body region BR in the cell region CR, and a section of the drift region DR and the drift termination region DRT between the n-well region 205 and the at least one body region BR. Optionally, the Zener diode further includes the p-doped junction termination extension region 207. Referring to FIG. 2, the Zener diode D1 further includes a p+ region 204 embedded in the n-well region 205. The connection terminal CT is connected to the p+ region 204. The connection terminal CT may include a metallization. The connection terminal may also be referred to as contact node.

One way of operation of the Zener diode shown in FIG. 2 is explained below. For the purpose of explanation it is assumed that the semiconductor device 200 is in an off-state and that a voltage is applied between the drain and source terminals D, SM. In this operation mode, a space charge region expands from the last body region BR in the cell region CR into the edge termination region RR. The lateral extension of the space charge region increases as the blocking voltage applied between the drain D and source S terminals of the semiconductor device 200 increases. When the space charge region reaches the p+ region 204 in the edge termination region RR a current flow via the drain D and the resistor R1 will start. Referring to FIG. 1, the resistor is connected between the drain D and the Zener diode. The implementation of the resistor in the example shown in FIG. 2 is explained below. The voltage limiting function of the Zener diode D1 as shown in the embodiment of FIG. 2 is realized not by a tunnelling effect or avalanche effect but by a punch of the electric field to the p+ region 204.

Thereby, the p+ region 204 of the Zener diode D1 can probe the potential of the space-charge region of the device. An adjustment of the voltage potential, at which the space-charge region comes close to the p+ region 204, can be provided by an appropriate doping level of the n-well region 205. Examples of an adjustment of the voltage potential, at which the space-charge region comes close to or in contact with the p+ region 204, on the basis of the doping level of the n-well region 205, are described herein below with respect to FIGS. 3 and 4. At the connection terminal metallization CT, the gate of the second field-effect transistor T2 which can be provided as a separate, discrete circuit element, can be electrically connected.

According to one embodiment, the resistor R1 is monolithically integrated in the edge termination region RR of the integrated semiconductor device 200. As shown in FIG. 2, the resistor R1 is formed as an n-region 208 between two n+ regions 206, the regions 206 and 208, respectively, being embedded in the dielectric layer OX. Due to a dielectric isolation of the resistor R1 with respect to the substrate, the resistor R1 is protected against disturbances.

A metallization structure can be used as the connection terminal CT described herein above with respect to FIG. 1. The metallization structure of the connection terminal CT contacts both one of the n+ regions 206 of the resistor R1 and the p+ region of the Zener diode D1. The other n+ region 206 the resistor R1 is connected to the drain metallization DM provided at the right side of the edge termination region RR of the integrated semiconductor device 200. The drain metallization DM is electrically connected to the drain terminal D of the integrated semiconductor device 200 by means of a lead connector 203 or a doped semiconductor region, e.g. in the outer rim OR.

According to an alternative, the resistor R1 can be provided as a polysilicon n+/n−/n+ structure, embedded in the dielectric layer OX. Thereby, the polysilicon resistor R1 can be formed on a gate oxide and/or on a field oxide. According to another embodiment, the n region 208 and the n+ regions 206 are not formed as semiconductor regions but as conductor regions with an appropriate resistance.

A method of manufacturing an integrated semiconductor device 200 can include the steps of providing a semiconductor substrate having a surface, forming an optional first epitaxial layer n++ on the surface of the semiconductor substrate, forming a second epitaxial layer n on the first epitaxial layer n++, and forming a weakly n-doped drift region DT in the cell region CR and/or a weakly n-doped drift region termination DRT in the edge termination region RR, on the second epitaxial layer n+. According to another embodiment, the first epitaxial layer n++ is omitted and the second epitaxial layer is directly applied to the substrate. In the cell region CR, p-doped columns and n-doped columns connected to the body region BR are formed. In the edge termination region RR arranged between the outer rim OR and the cell region an n-well region 205 and a p+ region 204 are formed, the n-well region 205 and the p+ region 204 forming the Zener diode D1 and being embedded in the drift region termination DRT. Thereby, the Zener diode D1 in monolithically integrated in the semiconductor device 200. Furthermore, the method includes the steps of forming a body region BR on the p-doped column, forming a source region S in the body region BR, forming a dielectric layer OX on the drift regions DT and DRT, providing a gate region G isolated from the source region, in the cell region CR, forming a n-region 208 between two n+ regions 206, the regions 206 and 208, respectively, being embedded in the dielectric layer OX and forming the polysilicon resistor R1, electrically connecting one of the two n+ regions 206 to the p+ region 204 of the Zener diode D1, and electrically connecting the other one the two n+ regions 206 to a drain metallization DM provided at outer rim OR. Thereby, the resistor R1 is monolithically integrated in the semiconductor device 200. The source region S can be electrically connected to a source electrode or source metallization, wherein the gate region can be connected to a gate electrode.

Furthermore, the first epitaxial layer n++ can be electrically connected to a drain electrode D. Thereby, the integrated semiconductor device 200 includes the transistor T1 which has the source electrode, the drain electrode, and the gate electrode, and a series connection of the resistor R1 and the Zener diode D1. The transistor T1 is formed predominantly in the cell region CR, whereas the resistor R1 and the Zener diode D1 are formed in the edge termination region RR. As shown in FIG. 2, the drain electrode D is electrically connected, via the lead connector 203, to the drain metallization DM formed in the edge termination region RR and in the outer rim OR. According to another embodiment, the connection of the drain electrode D to the drain metallization DM can be formed via a doping region in the semiconductor body, e.g. in the outer rim OR of the integrated semiconductor device 200. The drain metallization DM is further connected to the series connection of the resistor R1 and the Zener diode D1. Thereby, the n-well region of the Zener diode D1 can probe the potential difference between the drain electrode D and the source S of the transistor T1, i.e. drain-source voltage at the transistor T1.

According to another embodiment, the resistor R1 and/or the Zener diode D1 can be designed as discrete circuit elements provided separately from the chip region of the first field-effect transistor T1. The first field effect transistor T1, the second field-effect transistor T2, the separate Zener diode D1 and the separate resistor R1 can then be arranged, e.g. within a common multi-chip package.

Figure 3:
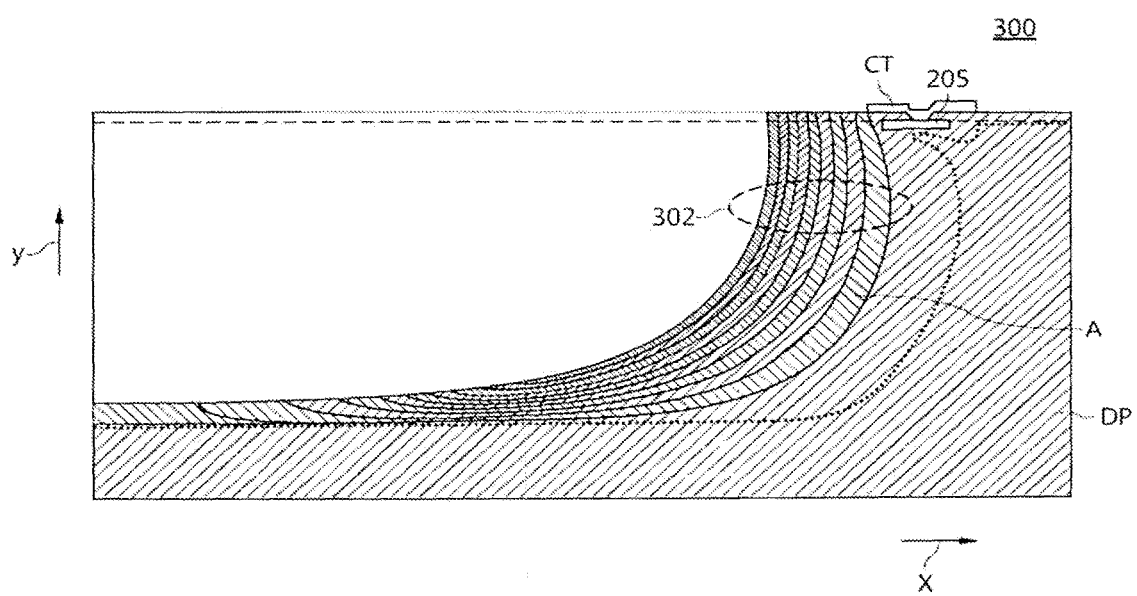
FIG. 3 schematically illustrates a distribution of the electrical potential in the first semiconductor device in an off-state.
Figure 4:
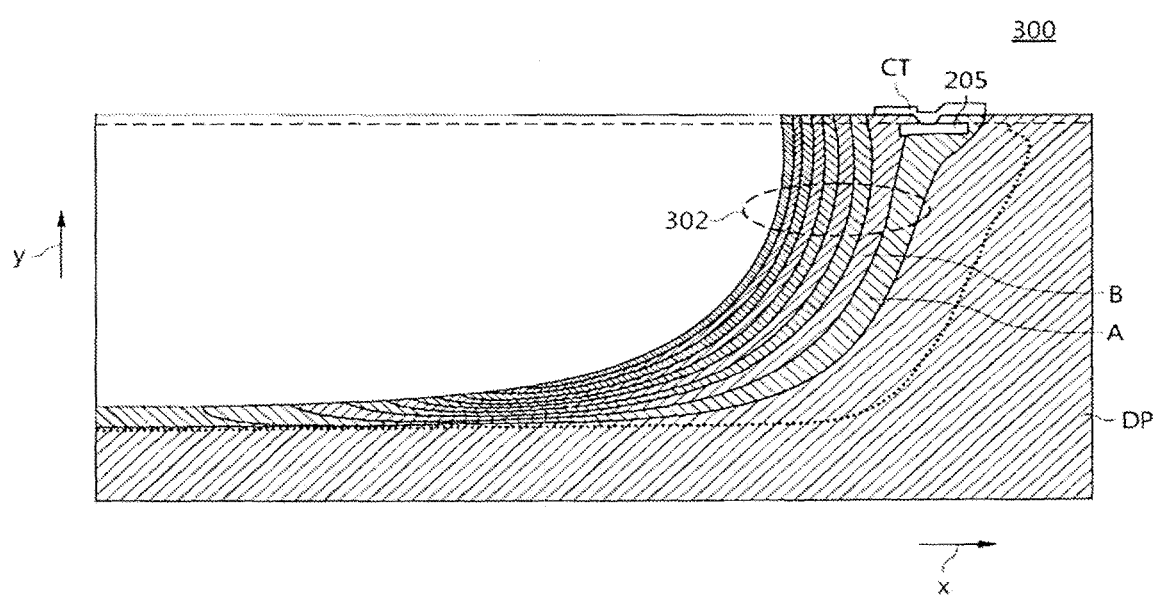
FIG. 4 schematically illustrates another distribution of the electrical voltage potential in the first semiconductor device in an off-state.

Referring now to FIGS. 3 and 4, voltage potential distribution graphs 300 in the cross section of the integrated semiconductor device 200, predominantly in a space-charge region, according to an embodiment are illustrated. FIG. 3 shows a voltage potential distribution graph 300 for a situation, where the n-well region 205 has an integral doping level of approximately $10^{12}$ cm$^{-2}$, whereas FIG. 4 shows a voltage potential distribution graph 300 for a situation, where the n-well region 205 has an integral doping level of approximately $5 \times 10^{11}$ cm$^{-2}$. The term "integral doping level" as used herein intends to describe a spatial integration of the n-doping in the n-well region 205 in a vertical direction starting at the first surface and reaching into the semiconductor body until the background doping of the drift region termination DRT is reached. The voltage potential distribution graphs 300 exhibit simulated equipotential lines 302 representing lines of constant voltage potential, related to a drain potential DP of the first field-effect transistor T1.

The equipotential lines 302 are shown superposed onto a cross section of the integrated semiconductor device 200 shown in FIG. 2. The drain potential DP (large area on the right side of FIG. 3) corresponds to the drain-source voltage drop 402 across the transistor T1, see FIG. 1. As can be seen in FIG. 3, a diode field terminal CT of the Zener diode D1, which corresponds to the connection terminal CT described herein above with respect to FIG. 2 is at drain potential DP. A region indicated by the reference numeral A in the voltage potential distribution graph 300 approaches the diode field terminal CT, if—according to the presented sample simulation—a doping of the n-well region 205 amounts to approximately $10^{12}$ cm$^{-2}$.

On the other hand, if a doping level of approximately $5 \times 10^{11}$ cm$^{-2}$ is provided, as shown in FIG. 4, a potential B lower than the potential A with B<A can approach the diode field terminal CT. Thus, potential distribution in the cross section of the integrated semiconductor device 200 can be adjusted by adapting the doping level of the n-well region 205. In this way, an effective limiting or Zener voltage of the Zener diode D1 can be adjusted, and thus, the transition between the normal operation mode and the protection mode of the high-voltage switch 100 can be controlled. According to an embodiment, the voltage of the transition between the normal operation mode and the protection mode is lower than the possible blocking voltage of the transistor T1.

Figure 5:
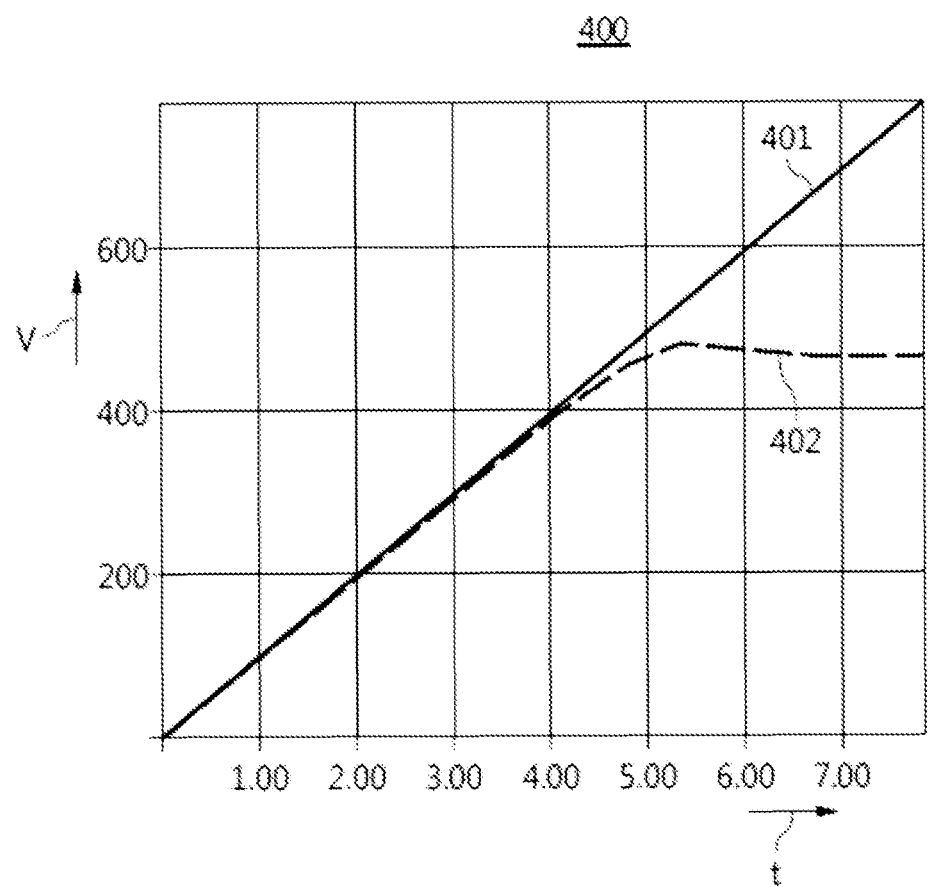
FIG. 5 shows a timing diagram which illustrates voltages across the cascode circuit and the first semiconductor device after switching off the cascode circuit.

FIG. 5 illustrates a voltage drop graph showing voltage drops at the high-voltage semiconductor switch 100, according to an embodiment. Two voltage drop curves V are indicated in the Figure, wherein the reference numeral V denotes a voltage in volts, wherein a reference numeral t represents a time in arbitrary units.

A first curve illustrates a total voltage drop evolution 401 over time t. The total drain-source voltage drop 401 is present across the high-voltage switch 100 shown in FIG. 1, i.e. between the drain D of the second field-effect transistor T2 and the source S of the first field-effect transistor T1.

On the other hand, a second curve depicts a voltage drop 402 across the first transistor T1, i.e. a voltage between the drain terminal of the first field-effect transistor T1 or the common node CN, and the source of the first field-effect transistor T1.

As can be seen from the voltage drop curves 401 and 402, respectively, the control unit CU clamps the voltage 401 across the first transistor to a rated voltage level, in the example to which FIG. 5 relates, to a voltage of approximately 480 V. Thereby, the first field-effect transistor T1 is protected against overvoltages above approximately 480 V which can occur at the drain-source path D-S of the high-voltage semiconductor switch 100 illustrated in FIG. 1.

The high-voltage semiconductor switch 100 can be used in connection with superjunction field-effect transistors for protecting these types of transistors against overvoltages. Thereby, the second field-effect transistor T2 can be used for protecting the first field-effect transistor T1 which can be designed as a superjunction FET.

Figure 6:
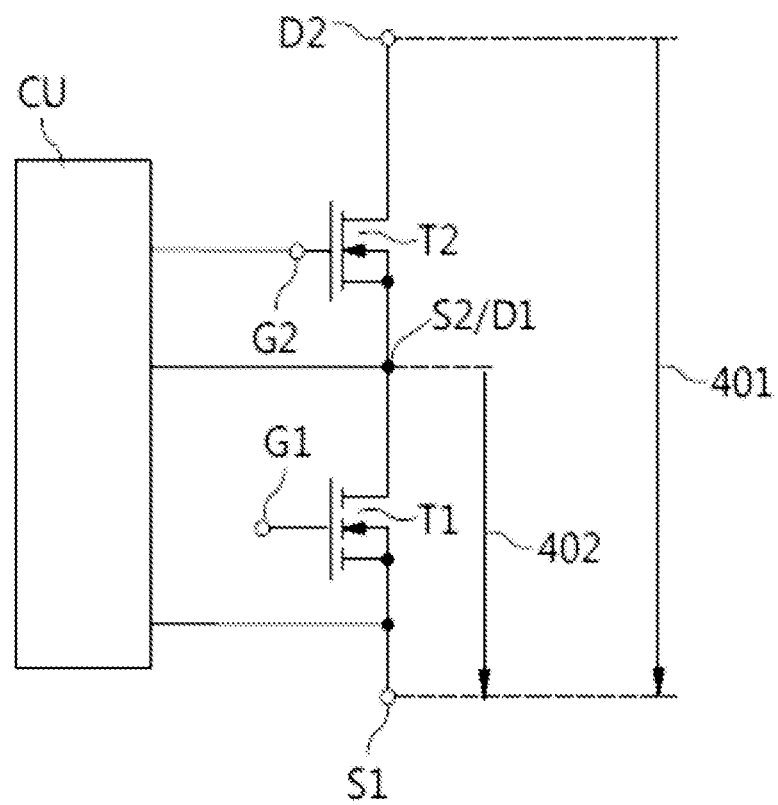
FIG. 6 illustrates a cascode circuit according to an embodiment.

FIG. 6 illustrates a schematic block diagram of a high-voltage semiconductor switch 100, according to an embodiment which can be described with other embodiments herein. The high-voltage semiconductor switch 100 is designed for switching a high voltage 401 and includes the first field-effect transistor T1 having a source S1, a drain D1 and a gate G1, and being adapted for switching the voltage 402 at a rated high-voltage level. Herein the first field-effect transistor T1 is provided as a normally-off enhancement-mode transistor. Furthermore, the second field-effect transistor T2 having a source S2, a drain D2 and a gate G2 is provided, wherein the second field-effect transistor T2 is connected in series to the first field-effect transistor T1. Thereby the source S2 of the second field-effect transistor T2 is connected to the drain D1 of the first field-effect transistor T1. The second field-effect transistor T2 is provided as a normally-on depletion-mode transistor. A control unit CU is connected to the drain D1 of the first field-effect transistor T1 and to the source S2 of the second field-effect transistor T2, respectively. In addition to that, the gate G2 of the second field-effect transistor T2 and the source S1 of the first field-effect transistor T1 are connected to the control unit CU. Thereby, the control unit CU is operable for blocking the second field-effect transistor T2 if a drain-source voltage 402 across the first field-effect transistor T1 exceeds the rated high-voltage level, as has been described herein above with reference to FIG. 1.

Figure 7:
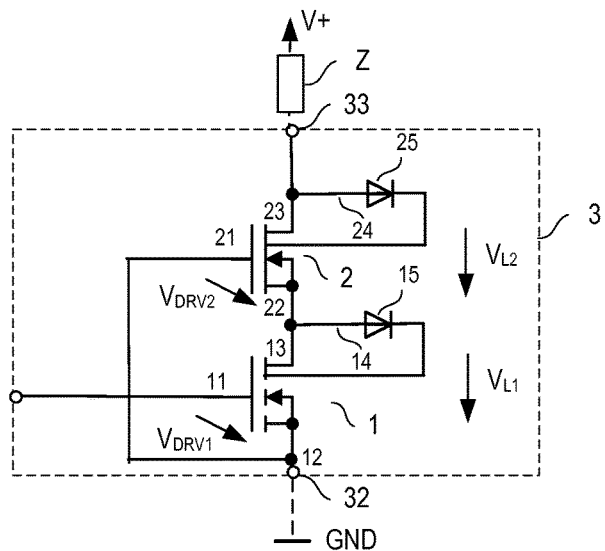
FIG. 7 illustrates a cascode circuit with a first semiconductor device and a second semiconductor device according to another embodiment.

FIG. 7 illustrates another embodiment of an electronic circuit, in particular, a cascode circuit. Like the cascode circuit explained herein before, the cascode circuit shown in FIG. 7 includes a first semiconductor device 1, and a second semiconductor device 2. The first semiconductor device 1 includes a load path between a first load node 12 and a second load node 13, and a control node 11, and the second semiconductor device 2 includes a load path between a first load node 22 and a second load node 23, and a control node 21. The load paths of the first semiconductor device 1 and the second semiconductor device 2 are connected in series by having connected the second load node 13 of the first semiconductor device 1 to the first load node 22 of the second semiconductor device 2.

In the embodiment shown in FIG. 7, the second semiconductor device 2 is implemented as a MOSFET. In this case, the first load node 22 corresponds to a source node, the second node load 23 corresponds to a drain node, and the control node 21 corresponds to a gate node of the MOSFET 2. The MOSFET 2 shown in FIG. 1 is drawn as a depletion (normally-on) MOSFET. However, implementing the second semiconductor device 2 as a normally-on MOSFET is only an example. Any other type of normally-on transistor device such as, for example, a JFET (Junction Field-Effect Transistor) may be used as well. Although the second semiconductor device 2 is drawn as an n-type transistor device, it should be noted, that the second semiconductor device 2 could be implemented as a p-type transistor device as well.

The second semiconductor device 2 is a voltage-controlled semiconductor device which switches on and off dependent on the drive voltage $V_{DRV2}$ received between the control node (gate node) 21 and the first load node (source node) 22. The first semiconductor device and the second semiconductor device 2 are connected in series such that the second semiconductor device 2 receives as the drive voltage $V_{DRV2}$ the load path voltage $V_{L1}$ of the first semiconductor device. For this, the control node 21 of the second semiconductor device is connected to the first control node 12 of the first semiconductor device 1.

In the embodiment shown in FIG. 7, the first semiconductor device 1 is implemented as a transistor device, specifically as a MOSFET and, more specifically, as an n-type MOSFET. In this case, the first load node 12 is a source node, and the second load node 13 is a drain node. The first semiconductor device 1 further includes a control node 11 which is formed by a gate node of the first semiconductor device implemented as a MOSFET. The first semiconductor device 1 is configured to receive a drive voltage $V_{DRV1}$ between the control node 11 and first load node 12 and switches on and off dependent on a voltage level of this drive voltage $V_{DRV1}$. The first semiconductor device 1 shown in FIG. 7 is drawn as an enhancement (normally-off) MOSFET. However, the first semiconductor device 1 is not restricted to be implemented as a normally-off transistor device, but may be implemented as a normally-on transistor device as well. Further, the first semiconductor device 1 is not restricted to be implemented as a MOSFET, any other type of transistor device such as, for example, a JFET, a BJT (Bipolar Junction Transistor), an IGBT (Insulated Gate Bipolar Transistor) may be used as well.

Referring to FIG. 7, the cascode circuit 3 includes a load path which is formed by the series circuit including the load paths of the first semiconductor device 1, and the second semiconductor device 2. This load path of the cascode circuit 3 is connected between a first load node 32 and a second load node 33 of the cascode circuit 3. The cascode circuit 3 further includes a control node 31 which is connected to the control node 11 of the first semiconductor device 1. The cascode circuit 3 may be used as an electronic switch that switches on and off based on a drive voltage $V_{DRV1}$ received between control node 31 and the first load node 32 of the cascode circuit 3, wherein this drive voltage equals the drive voltage $V_{DRV1}$ of the first semiconductor device 1 in the embodiment shown in FIG. 1. In a switched-on state (briefly referred to as on-state in the following) the load path of the cascode circuit 3 conducts so that a current may flow through the load path. In a switched-off mode (briefly referred to as off-mode in the following) the load path blocks so as to prevent a current from flowing through the load path.

One way of operation of the cascode circuit 3 shown in FIG. 7 is explained below with reference to timing diagrams shown in FIG. 2. Just for the purpose of this explanation it is assumed that the cascode circuit 3 has its load path connected in series with an electrical load Z, and that the series circuit with the cascode circuit 3 and the load Z is connected between supply terminals which receive supply potentials such as, for example, a reference potential GND and the positive supply potential V+, respectively. However, this is only an example. The cascode circuit 3, like a conventional electronic switch, may be used in a variety of other circuit topologies (not shown in the figures) as well.

Figure 8:
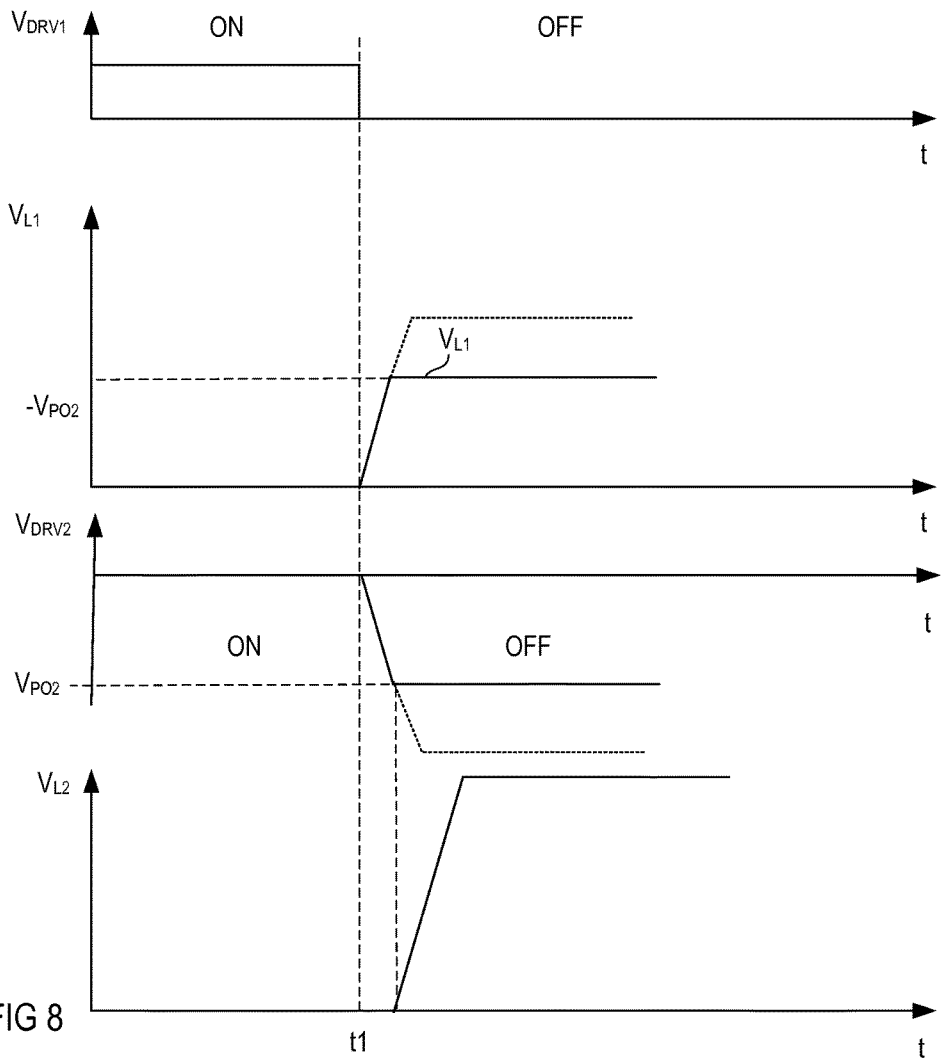
FIG. 8 shows timing diagrams that illustrate one way of operation of the cascode circuit shown in FIG. 7.

FIG. 8 schematically illustrates timing diagrams of the drive voltage $V_{DRV1}$ and a load path voltage $V_{L1}$ of the first semiconductor device 1, and the drive voltage $V_{DRV2}$ and a load path voltage $V_{L2}$ of the second semiconductor device 2. The load path voltage $V_{L1}$ of the first semiconductor device 1 is the voltage between the second load node 13 and the first load node 12. Consequently, the load path voltage $V_{L2}$ of the second semiconductor device 2 is the voltage between the second load node 23 and the first load node 22.

Just for the purpose of explanation it is assumed that a voltage level of the drive voltage $V_{DRV1}$ which switches on the first semiconductor device 1 is a high level, and that a voltage level of the drive voltage $V_{DRV1}$ which switches off the first semiconductor device is a low-level. In FIG. 8, t1 denotes a time at which the drive voltage $V_{DRV1}$ switches the first semiconductor device 1 from the on-state to the off-state. This is schematically illustrated by the voltage level of the drive voltage $V_{DRV1}$ dropping from the high-level to the low-level at t1. During the on-time (which is the time when the drive signal $V_{DRV1}$ has the on-level) of the first semiconductor device 1, the load path voltage $V_{L1}$ of the first semiconductor device 1 is very low as compared to the voltage blocking capability of the first semiconductor device 1, and is drawn to be substantially zero (0) in the timing diagram of the load path voltage $V_{L1}$ shown in FIG. 8. This causes the second semiconductor device 2 to be in the on-state when the first semiconductor device 1 is in the on-state. The drive voltage $V_{DRV2}$ of the second semiconductor device 2 corresponds to the load path voltage $V_{L1}$ of the first semiconductor device 1 or, more precisely, the drive voltage $V_{DRV2}$ of the second semiconductor device 2 corresponds to the negative load path voltage $V_{L1}$ of the first semiconductor device 1. That is, $$V_{DRV2} = -V_{L1} \qquad (2).$$

In the present embodiment, the second semiconductor device 2 is a normally-on device, which means that the second semiconductor device 2 is in the on-state when the voltage level of the drive voltage $V_{DRV2}$ is 0. An n-type normally-on transistor device such as, for example, the depletion MOSFET shown in FIG. 7, switches off when the voltage level of the drive voltage decreases to a negative pinch-off level. The negative pinch-off level of the second transistor device 2 will be referred to as $V_{PO2}$ in the following.

As the first semiconductor device 1 switches off at time t1 the load path of the first semiconductor device 1 blocks so that the load path voltage $V_{L1}$ starts to increase. It should be noted that in FIG. 8 the load path voltage is only schematically illustrated. As the load path voltage $V_{L1}$ increases, the drive voltage $V_{DRV2}$ of the second transistor device 2 decreases. The second semiconductor device switches off as the drive voltage $V_{DRV2}$ reaches the pinch-off voltage $V_{PO2}$. At this time, the load path voltage $V_{L2}$ of the second semiconductor device 2 starts to increase. After the second semiconductor device 2 has switched off, the load path voltage $V_{L2}$ of the second semiconductor device 2 increases until the first load path voltage $V_{L1}$ plus the second load path voltage $V_{L2}$ equals the supply voltage. As shown with dotted lines in FIG. 2, the drive voltage $V_{DRV2}$ of the second transistor device 2 may decrease to a value lower than the pinch-off voltage $V_{PO2}$. Also, the load path voltage $V_{L1}$ may further increase after the pinch-off voltage $V_{PO2}$ has been reached. For the ease of illustration, delay times that may occur e. g. between a falling edge of the drive voltage $V_{DRV1}$ and the resulting rising edge of the of the load path voltages $V_{L1}$, $V_{L2}$ of the first and the second semiconductor device 1, 2, respectively, are not shown in FIG. 8.

When a semiconductor device, such as one of the first and second semiconductor devices shown in FIG. 7, is in an off-state and when a voltage other than zero is applied to a load path a leakage current may flow through the semiconductor device. The effect of such leakage currents in a cascode circuit of the type shown in FIG. 7 is explained in the following. For the purpose of explanation it is assumed that the cascode circuit 3 has been switched off so that each of the first and second semiconductor devices 1, 2 has a load path voltage $V_{L1}$, $V_{L2}$ which is a share of the overall voltage V+ applied to the cascode circuit 3 in the off state. If, for example the second semiconductor device 2 generates a leakage current then this leakage current—if no additional measures are taken—not only flows through the second semiconductor device 2, but the leakage current also flows through the first semiconductor device 1. As the first semiconductor device is blocking when the cascode circuit is in the off-state the leakage current generated by the second semiconductor device may cause an avalanche breakthrough in the first semiconductor device 1. Because the current level of the leakage current, usually, is rather low, the amount of energy dissipated in the first semiconductor device 1 in the avalanche breakthrough is rather low so that there is a low risk of thermally damaging the first semiconductor device 1. However, there are other degradation effects that may occur induced by charge carriers generated in the avalanche breakthrough. Those degradation effects include, for example, a drift of the device's blocking voltage by incorporating electrical charges in a dielectric of the device.

In order to prevent or at least reduce those negative effects associated with the generation of a leakage current, the first semiconductor device 1 shown in FIG. 7 includes a rectifier element 15 connected between the second load node (drain node) and a section of the first semiconductor device's 1 drift region. This rectifier element 15 is drawn as a diode in the embodiment shown in FIG. 7. One possible implementation of this rectifier element is explained with reference to FIG. 9 herein below. Optionally, the second semiconductor device 2 also includes a rectifier element 25 connected between its second load node 23 and a drift region of the second semiconductor device 2. The rectifier element 25 in the second semiconductor device 2 may be used similar to the rectifier element 15 when a further second semiconductor device (not shown in FIG. 7) is connected between the drain node 23 of the second semiconductor device 2 and the load Z.

Figure 9:
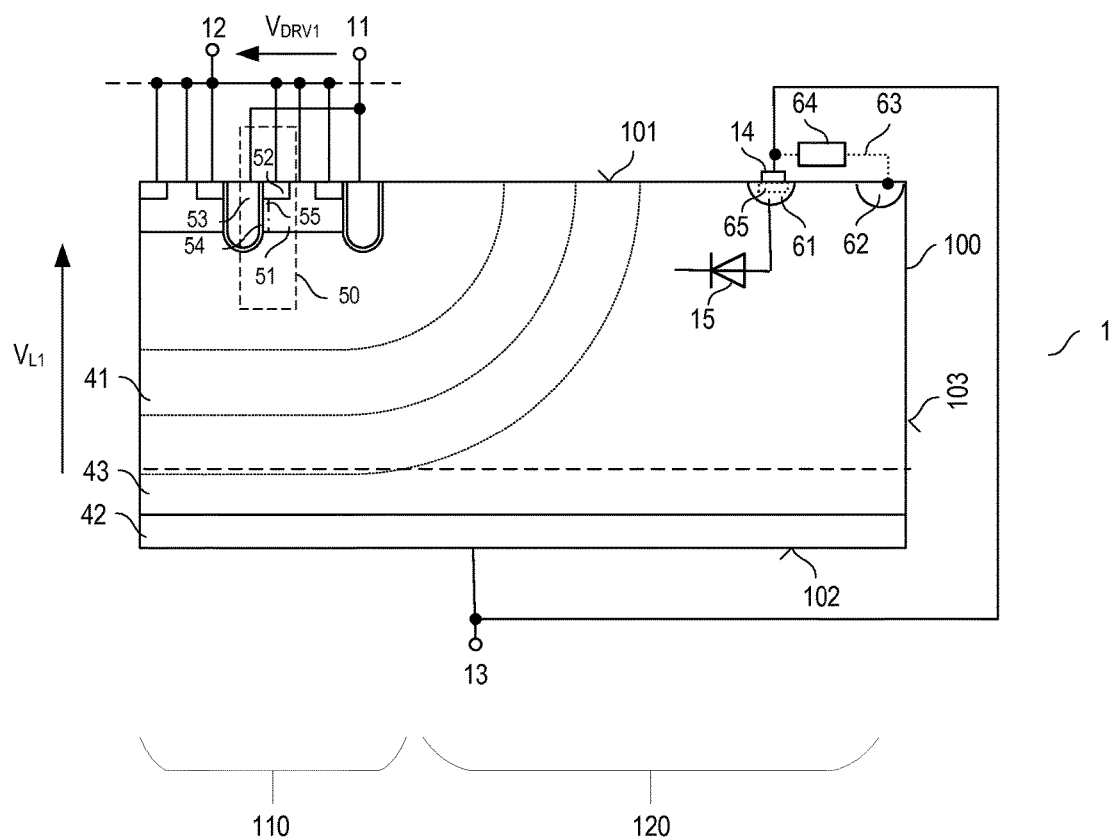
FIG. 9 schematically illustrates a vertical cross sectional view of a section of the first semiconductor device according to one embodiment.
Figure 10:
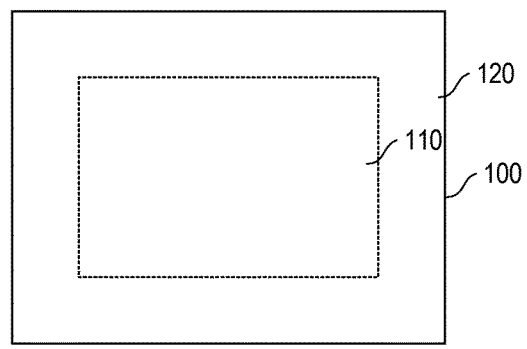
FIG. 10 schematically illustrates a top view of the semiconductor device shown in FIG. 9.

FIG. 9 shows a vertical cross sectional view of a section of one embodiment of the first semiconductor device 1. This first semiconductor device is implemented as a transistor device, in particular, as a MOSFET. Referring to FIG. 9, the first semiconductor device 1 includes a semiconductor body 100 with a first surface 101 and a second surface 102 opposite the first surface 101. FIG. 9 shows the semiconductor body 100 in a vertical section plane, which is a section plane perpendicular to the first and second surfaces 101, 102. The semiconductor body 100 includes an inner region 110 and an edge region 120. Referring to FIG. 10 which schematically illustrates a top view of the semiconductor body 100, the edge region 120 surrounds the inner region 110. That is, the edge region 120 terminates the first semiconductor device 1 implemented in the semiconductor body 100 in a lateral direction of the semiconductor body 100. According to one embodiment, the edge region 120 adjoins an edge surface of the semiconductor body 100 on those sides which face away from the inner region 110. The "edge surface" is a surface that terminates the semiconductor body 100 in lateral directions. According to another embodiment, besides the first semiconductor device 1, at least one further semiconductor device (not shown) is implemented in the semiconductor body 100. In this embodiment, the edge region 120 surrounds the inner region 110 and is arranged between the inner region 110 and those regions of the semiconductor body 100 where the at least one further semiconductor device is implemented.

Referring to FIG. 9, the MOSFET includes a drift region 41 of a first doping type in the inner region 110 and the edge region 120, and a drain region 42 at least in the inner region 110. In the embodiment shown in FIG. 9, the drain region 42 is implemented in the inner region 110 and the edge region 120. According to another embodiment (not shown) the drain region 42 is omitted at least in a part of the edge region 120. The drain region 42 may adjoin the drift region 41. According to a further embodiment a field-stop region 43 of the same doping type as the drift region 41, but more highly doped than the drift region 41 is arranged between the drift 41 and the drain region 42. The boundary between the field-stop region 43 and the drift region 41 is illustrated as dashed line in FIG. 9. The doping concentration of the drift region 41 is, for example, between 1E13 $cm^{-3}$ and 1E18 $cm^{-3}$ and, in particular, between 1E15 $cm^{-3}$ and 1E17 $cm^{-3}$ and the doping concentration of the drain region 42 is, for example between 1E19 $cm^{-3}$ and 1E21 $cm^{-3}$.

Referring to FIG. 9, the MOSFET includes at least one transistor cell 50 in the inner region 110. The transistor cell includes a body region 51 of a second doping type complementary to the first doping type, and a source region 52 of the first doping type. The body region 51 forms a pn-junction with the drift region 41 and separates the source region 52 from the drift region 41. The doping concentration of the source region 52 is, for example, between 1E19 $cm^{-3}$ and 1E21 cm$^{-3}$, and the doping concentration of the body region 51 is, for example, between 1E17 cm$^{-3}$ and 1E19 cm$^{-3}$.

Referring to FIG. 9, a gate electrode 53 is adjacent to the body region 51 and is dielectrically insulated from the body region 51 by a gate dielectric 54. The gate electrode 53 serves to control a conducting channel along the gate dielectric 54 in the body region 51 between the source region 52 and the drift region 41. The source region 52 and, optionally, the body region 51 are electrically connected to the first load node (source node) 12. The drain region 42 is electrically connected to the second load node (drain node) 13, and the gate electrode 53 is electrically connected to the control node (gate node) 11. These individual nodes of the first semiconductor device 1 are only schematically illustrated in FIG. 9.

In the embodiment shown in FIG. 9—as well as in the embodiments explained herein below—the gate electrode 53 is implemented as a trench electrode. That is, the gate electrode 53 is located in a trench which extends into the semiconductor body from the first surface 101. However, this is only an example. The gate electrode may be implemented as a planar gate electrode above the first surface as well.

According to one embodiment, the MOSFET includes a plurality of transistor cells 50 which are connected in parallel by having the source regions 52 connected to the first load node 12, and by having the gate electrodes 53 connected to the control node 11. Further, the individual transistor cells 50 may share the drift region 41 and the drain region 42 (as illustrated in FIG. 9).

The transistor shown in FIG. 9 can be implemented as an n-type transistor device or as a p-type transistor device. In an n-type transistor device the source region 52 and the drift region 41 are n-doped, while the body region 51 is p-doped. In a p-type device the individual device regions are doped complementary to the corresponding device regions in an n-type device. Further, the transistor can be implemented as a MOSFET or as an IGBT. In the MOSFET, the drain region 42 has the same doping type as the drift region 41, and in an IGBT the drain region 42 has a doping type complementary to the doping of the drift region 41. Further, the transistor can be implemented as an enhancement device (normally-off device) or as a depletion device (normally-on device). In a normally-off device, the body region 51 adjoins the gate dielectric 54 between the source region 52 and the drift region 41. A normally-on device includes a channel region 55 of the same conductivity type as the source region 52 and the drift region 41 along the gate dielectric 54 between the source region 42 and the drift region 41. Such channel region 55 is illustrated in dashed and dotted lines in one of the transistor cells shown in FIG. 9. The doping concentration of the drift region 41 in the edge region 120 may correspond to the doping concentration in the inner region 110, or may be different. Referring to FIG. 9, the transistor further includes a rectifier element connected between a contact node 14 and the source node. The contact node 14 is only schematically illustrated in FIG. 9. The contact node 14, may include a metallization, a highly doped polycrystalline semiconductor material, or the like. In the embodiment shown in FIG. 9, the rectifier element is implemented as a diode and includes a doped region 61 of the second doping type in the edge region 120. This doped region 61 forms a pn-junction with the drift region 41 in the edge region 120 and will be referred to as diode region in the following. A doping concentration of the doped region 61 in those regions where it forms the pn-junction with the drift region is, for example, between 1E17 cm$^{-3}$ and 1E21 cm$^{-3}$.

The contact node 14 is electrically connected to the diode region 61. In order to electrically connect the contact node 14 to the diode region 61 the diode region 61 may include a higher doped contact region 65 (illustrated in dotted lines).

Further, the contact node 14 and the diode region 61, respectively, are electrically connected to the drain node 13. An electrical connection between the diode region 61 and the drain node 13 is only schematically illustrated in FIG. 9. This electrical connection may be implemented using conventional wiring techniques.

According to one embodiment, the edge region 120 adjoins an edge surface 103 of the semiconductor body 100. In this embodiment, the doped region 61 is connected to a contact region 62 which may be of the same or the opposite doping type as the drift region 41. This contact region is located at the first surface and at the edge surface 103 or close to the edge surface 103. By virtue of crystal imperfections along the edge surface 103 there is an electrically conducting path in the semiconductor body 100 long the edge surface 103 (even in those cases in which there would be a blocking pn-junction between the first surface and the second surface of the semiconductor body) so that an electrical potential along the edge surface 103 and, consequently, the contact region 62 corresponds to the electrical potential of the drain region 42. Thus, from an electrical perspective, connecting the doped region 61 to the contact region is equivalent to connecting the doped region 61 to the drain region 41 and the drain node, respectively.

An electrical connection 63 (illustrated in dotted lines in FIG. 9) between the doped region 61 and the contact region 62 is only schematically illustrated in FIG. 9. This connection 63 may be implemented using a metal, a highly doped polycrystalline semiconductor material (such as polysilicon) or the like. According to one embodiment, a doping concentration of the contact region 62 is high enough to provide for an ohmic contact between the connection 63 and the contact region 62. The doped region 61 may include a higher doped contact region (not shown) in those sections where it is connected to the connection 63. According to one embodiment, a doping concentration of this contact region is high enough to provide for an ohmic contact between the connection 63 and the doped region 61. The doping concentration of the connection 63 is, for example, between 1E18 cm$^{-3}$ and 1E21 cm$^{-3}$ and the doping concentration of the doped region 61 is, for example, between 1E17 cm$^{-3}$ and 1E21 cm$^{-3}$.

According to one embodiment, the doped region 61 is connected to the drain node 13 through an electrical resistor 64. This resistor may be integrated in the electrical connection 63 or any other electrical connection which connects the doped region 61 to the drain node 13. According to one embodiment, the resistor is a polysilicon resistor.

The pn-junction between the doped region 61 and the drift region 42 forms the rectifier element 15 shown in FIG. 7 between the drain node 13 and the drift region of the first semiconductor device 1. The diode region 61 is spaced apart from the pn-junction between the body region 51 and the drift region 41. In the present embodiment, the diode region 61 is spaced apart from this pn-junction substantially in the lateral direction of the semiconductor body 100 and may adjoin the first surface 101. The first surface 101 is the surface in the region of which the transistor cells 50 are located in the semiconductor body 100.

One way of operation of the first semiconductor device 1 shown in FIG. 9 and, in particular, one way of operation of the diode region 61 connected to the drain node 13 is explained in the following. Referring to the explanation above, the first semiconductor device 1 can be operated in an on-state and an off-state. For the purpose of explanation it is assumed that the first semiconductor device is implemented as an n-type transistor device and that a positive load voltage $V_{L1}$ is applied between the second load node (drain node) 13 and the first load node (source node) 12.

In the on-state, the level of the drive voltage $V_{DRV1}$ between the control node 11 and the first load node 12 is such that the gate electrode 53 causes a conducting channel between the source region 52 and the drift region 41 along the gate dielectric 54, either by generating an inversion channel in the body region 51 along the gate dielectric (in case of an enhancement device), or by not-depleting the channel region 55 (in case of a depletion device). In this operation mode, the load path voltage $V_{L1}$ is substantially given by the voltage drop across the drift region 41 and is substantially defined by the current through the transistor. This load path voltage is relatively low as compared to the voltage blocking capability of the transistor. For example, the load path voltages in the on-state range between several millivolts and several 100 millivolts in transistors with voltage blocking capabilities ranging between several 10V and several 100 V. In the on-state, substantially no current flows through the diode region 61 because of the forward voltage of the pn junction between the diode region 61 and the drift region 42 (which is about 0.6V when the semiconductor body 100 is made of silicon).

In the off-state, the drive voltage $V_{DRV1}$ is such that the gate electrode 53 prevents a conducting channel between the source region 52 and the drift region 41, either by not generating an inversion channel in the body region 51 (in an enhancement device), or by depleting the channel region 55 (in a depletion device). In this case, a voltage applied between the second load node 13 and the first load node 12 reverse biases the pn-junction between the body region 51 and the drift region 41 so that a space charge region (depletion region) expands in the drift region 41 beginning at the pn-junction. This space charge region expands deeper into the drift region 41 as the load path voltage $V_{L1}$ increases and depletes the background (basic) doping in the drift region 41. In FIG. 9, the dotted lines schematically illustrate equipotential lines of an electric field associated with the depletion region expanding in the drift region 41. As can be seen from FIG. 9, the depletion region expands in the drift region 41 in the direction of the drain region 42, but also expands in the edge region 120 in the lateral direction of the semiconductor body 100.

In the embodiment shown in FIG. 9, the equipotential lines are drawn to have the same distance in the inner region 110 and the edge region 120. However, this is only for the purpose of explanation. The semiconductor device 1 may include means that reduce the electrical field in the edge region 120, in particular along the first surface 101, as compared to the electrical field in the inner region. In this case, equipotential lines in the lateral direction along the first surface 101 are more spaced apart than in the vertical direction in the inner region. That is, in the off-state, a distance between the pn-junction and the position of the maximum electrical potential (drain potential) may be shorter in the inner region 110 than in the edge region 120. Thus, the dimension of the edge region 120 in the lateral direction may be larger than the shortest distance between the pn-junction and the drain region 42.

The first semiconductor device 1 has a voltage blocking capability which corresponds to the maximum load path voltage the first semiconductor device 1 can withstand in the off-state without before an avalanche breakthrough sets in.

According to one embodiment, a position of the diode region 61 in the edge region 120 is such that the depletion region expanding in the drift region when the maximum voltage is applied does not reach the diode region 61. This may be obtained by suitably adjusting a distance between the diode region 61 and the pn-junction between the body region 51 and the drift region 41. According to one embodiment, a (shortest) distance between this pn-junction and the diode region 61 is longer than 100% of a (shortest) distance between the pn-junction and the drain region 42. This also applies to other embodiments of the first semiconductor device 1 explained herein below. The "length of the drift region 41 in the current flow direction" is the dimension of the drift region 41 in the direction in which the current flows through the drift region in the on-state of the first semiconductor device 1. In the embodiment shown in FIG. 9, as well as in the embodiments explained below, the current flow direction corresponds to the vertical direction of the semiconductor body 100. According to one embodiment, the distance between the pn-junction and the diode region 61 is shorter than 200% of the (shortest) distance between the pn-junction and the drain region 42. One way of operation of the diode region 61 is explained below. For the purpose of explanation it is assumed that the first semiconductor device is in the off-state and a current, such as a leakage current produced by the second semiconductor device 2 shown in FIG. 7, is driven into the drain node 13. This current causes the electrical potential at the drain node 13 to increase until the pn-junction between the diode region 61 and the drift region 41 is forward biased. The diode region 61 then injects minority charge carriers into the drift region 41 which, forced by the electrical field associated with the depletion region in the off-state, travel to the body region 51 which is connected to the first load node 12. Thus, a current may flow via the second load node 13, the diode region 61, the drift region 41, the body region 51 and the first load node 12 in the off-state of the first semiconductor device 1 without driving the first semiconductor device into the avalanche mode (which is an operation mode in which an avalanche breakthrough occurs in the drift region 41.

Figure 11A:
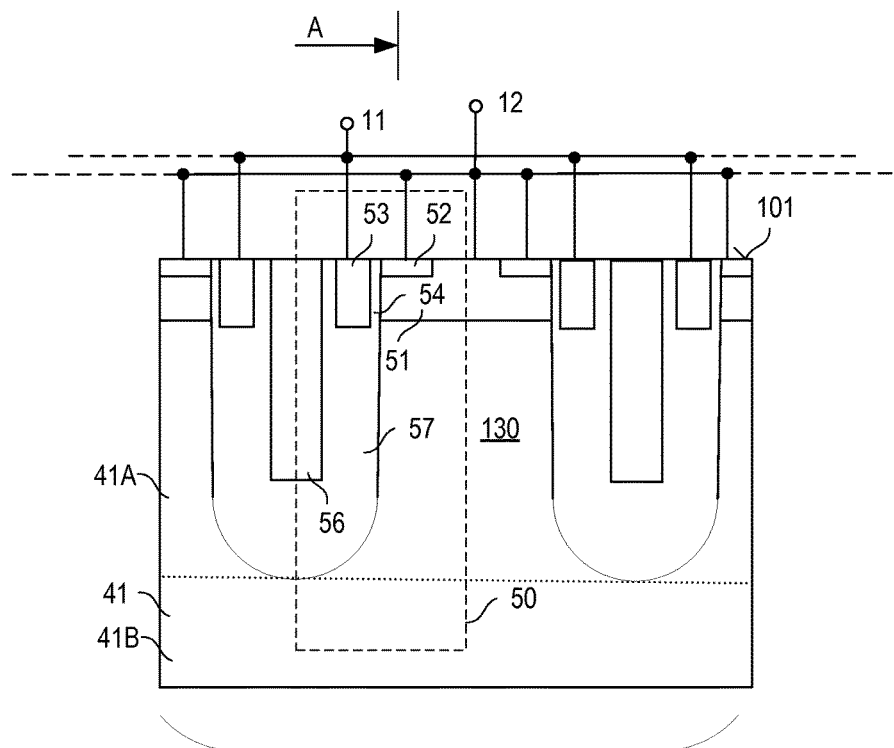
FIGS. 11A-11B illustrates a modification of an inner region of the semiconductor device shown in FIG. 9.
Figure 11B:
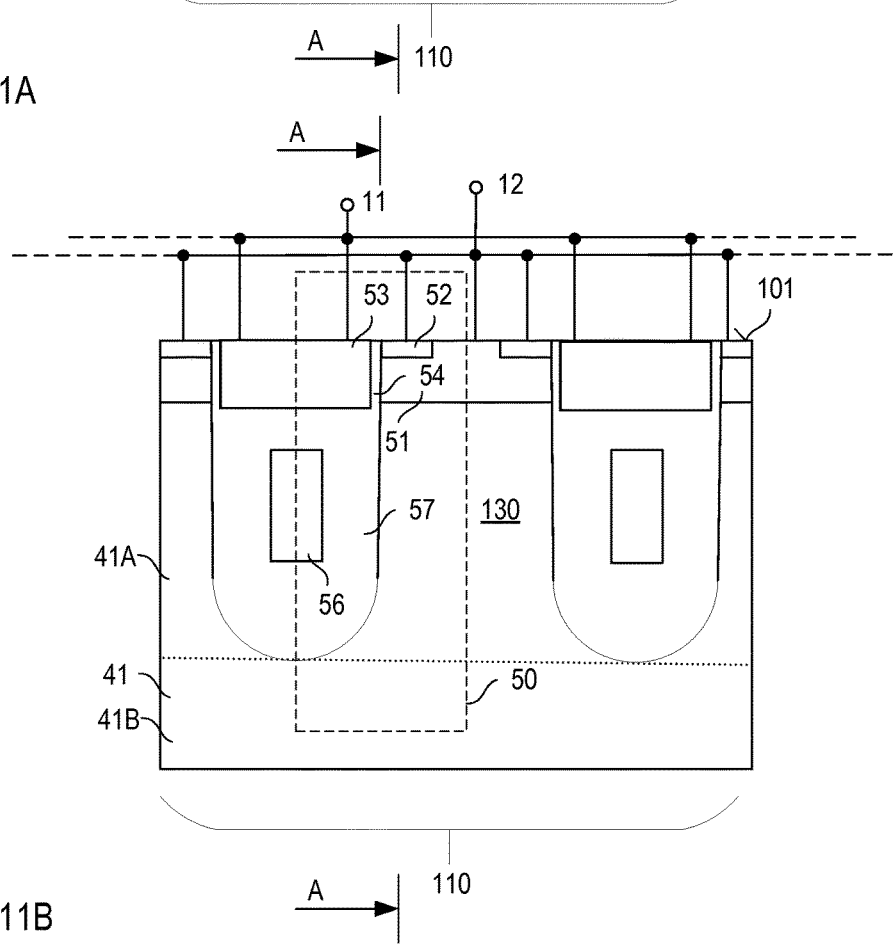

Although one specific embodiment of a transistor cell 50 is shown in FIG. 9 it should be noted that this is only for the purpose of illustration. The first semiconductor device may be implemented with any type of transistor cell. FIGS. 11A and 11B illustrate two other embodiments of a transistor cell 50. In these embodiments, the transistor cell 50, additionally to the body region 51, the source region 52, the gate electrode 53 and the gate dielectric 54 includes a field electrode 56 which extends into the drift region 41 and is dielectrically insulated from the drift region 41 by a field electrode dielectric 57. The field electrode 56 may either be connected to the first load node (source node) 12, or the control node (gate node) 11. However, none of these connections is explicitly shown in FIGS. 11A and 11B.

The purpose of providing the field electrode 56 is to provide countercharges to dopant charges in the drift region 41 when the transistor is in the off-state, that is, when the depletion region expands in the drift region 41. Thus, the drift region 41 may be implemented with a higher doping concentration than a conventional device without field electrode, so as to reduce the on-resistance of the MOS transistor.

According to one embodiment, the drift region 41 includes a first drift region section 41A adjacent the field electrodes 56 and the field electrode dielectrics, respectively, and a second drift region section 41B between the field electrode dielectrics and the drain region (not shown in FIGS. 11A and 11B). In these embodiments, the second drift region 41B section has a lower doping concentration than the first drift region section 41A.

Figure 12:
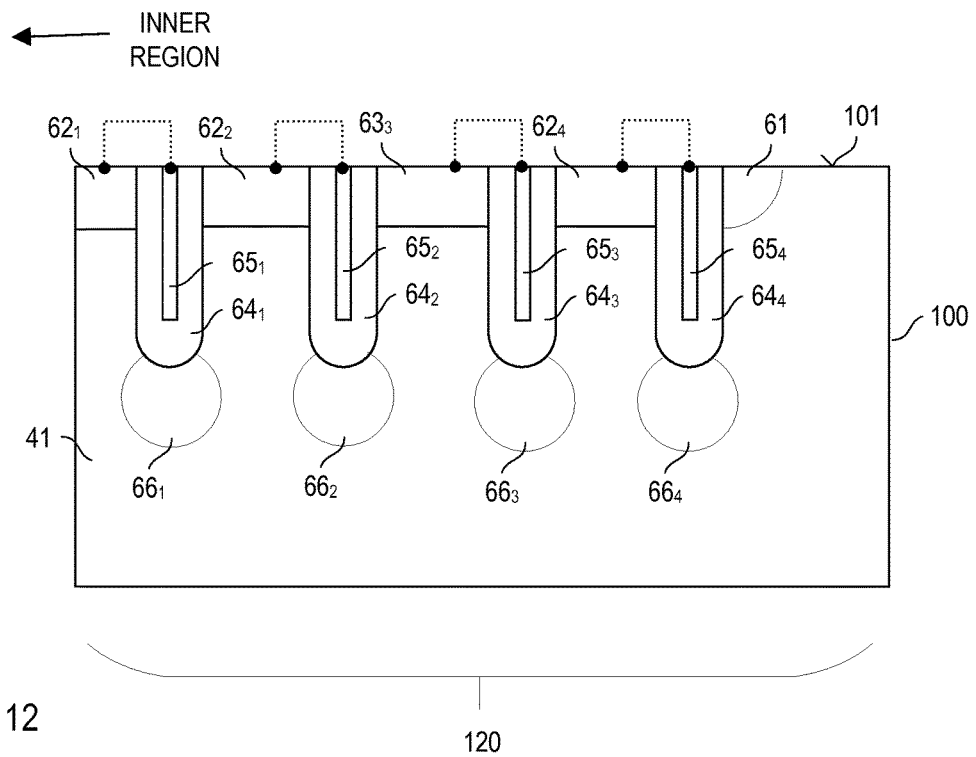
FIG. 12 illustrates a modification of an outer region of the semiconductor device shown in FIG. 9.

FIG. 12 illustrates another embodiment of the edge region 120 of the first semiconductor device 1. This edge region may be employed in any of the first semiconductor devices explained herein before. In this embodiment, the edge region 120 includes at least two trenches, with each of these two trenches including a field electrode $65_1$-$65_4$ which is dielectrically insulated from the drift region 41 by a field electrode dielectric $64_1$-$64_4$. Each of several doped regions $62_1$-$62_5$ of a doping type complementary to the doping concentration of the drift region 41 adjoins one of the field electrode dielectrics $64_1$-$64_5$ in the direction of the inner region (not shown in FIG. 12). Optionally, each field electrode $65_1$-$65_5$ is electrically connected (as illustrated in dotted lines in FIG. 12) to the doped region $62_1$-$62_5$ adjacent the field electrode $65_1$-$65_5$ in the direction of the inner region 110. The doped regions $62_1$-$62_5$ may adjoin the first surface (as shown in FIG. 12). According to another embodiment, According to one embodiment, the field electrodes $65_1$-$65_4$ are electrically floating. That is, they are not electrically connected to one of the terminals or semiconductor regions of the first semiconductor device 1.

Referring to FIG. 12, the diode region 61 is located in the edge region 120 such that each of the trenches with the field electrodes $65_1$-$65_5$ is arranged between the diode region 61 and the inner region. According to one embodiment, the diode region 61 adjoins an outermost field electrode trench, which is the trench (the one with the field electrode $65_4$ and the field electrode dielectric $64_4$ shown in FIG. 12) most distant to the inner region.

Figure 13:
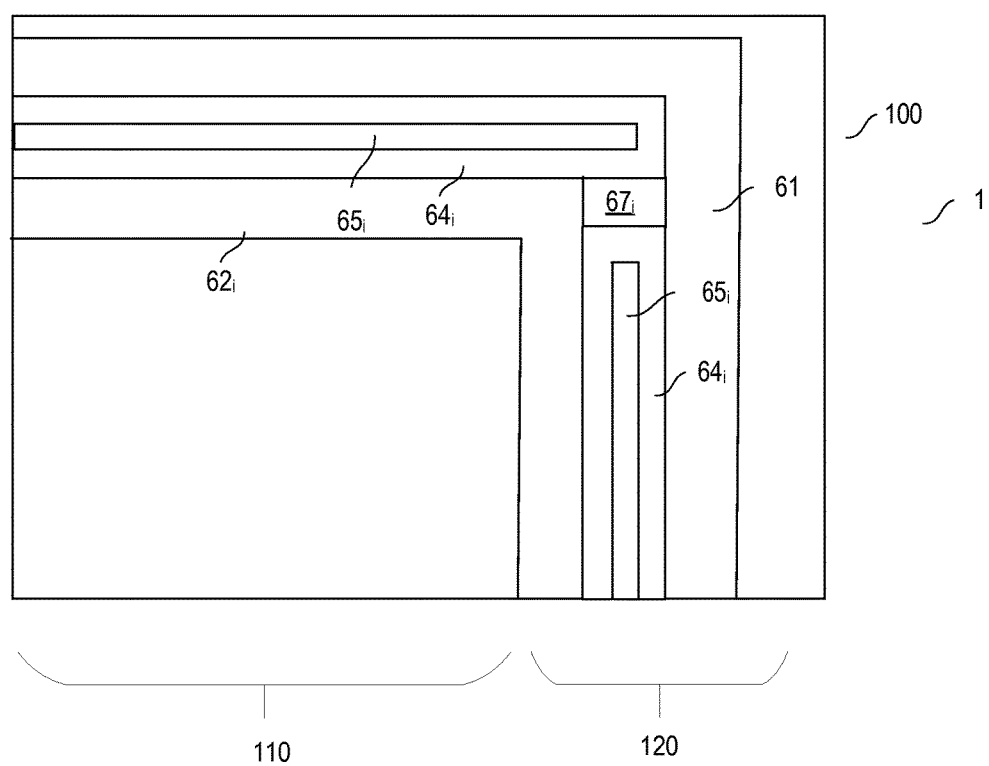
FIG. 13 shows a top view of one section of an outer region according to one embodiment.

The trenches with the field electrodes $65_1$-$65_4$ and the corresponding field electrode dielectrics $64_1$-$64_4$ may each have the form of a ring that surrounds the inner region 110. The ring can be rectangular (optionally with rounded corners), polygonal, elliptical, circular, or the like. According to another embodiment, the trenches are elongated trenches, with four or more of these elongated trenches forming a ring structure which surrounds the inner region. FIG. 13 schematically shows a top view of two of four of those elongated trenches of one "ring" surrounding the inner region 110. The ring shown in FIG. 12 is an outermost ring, that is, a ring adjacent the diode region 61. The other "rings" may be implemented in the same way (between the shown outermost ring and the inner region 110). In FIG. 10, $65_i$ denotes the field electrode, and $64_i$ denotes the corresponding field electrode dielectric in each of these elongated trenches. Referring to FIG. 13, the elongated trenches are spaced apart in corner regions of the ring structure. The "corner regions" are those regions where two elongated trenches are adjacent. The shortest distance between two elongated trenches of one ring structure can be different from the distance between the trenches of two neighboring ring structures shown in FIG. 12. The diode region 61 is separated from the doped region $62_i$ either by the trench (not shown) or by a doped region $67_i$ (as shown) of a doping type complementary to the doping type of the regions $62_i$ and the diode region 61, respectively.

Figure 14:
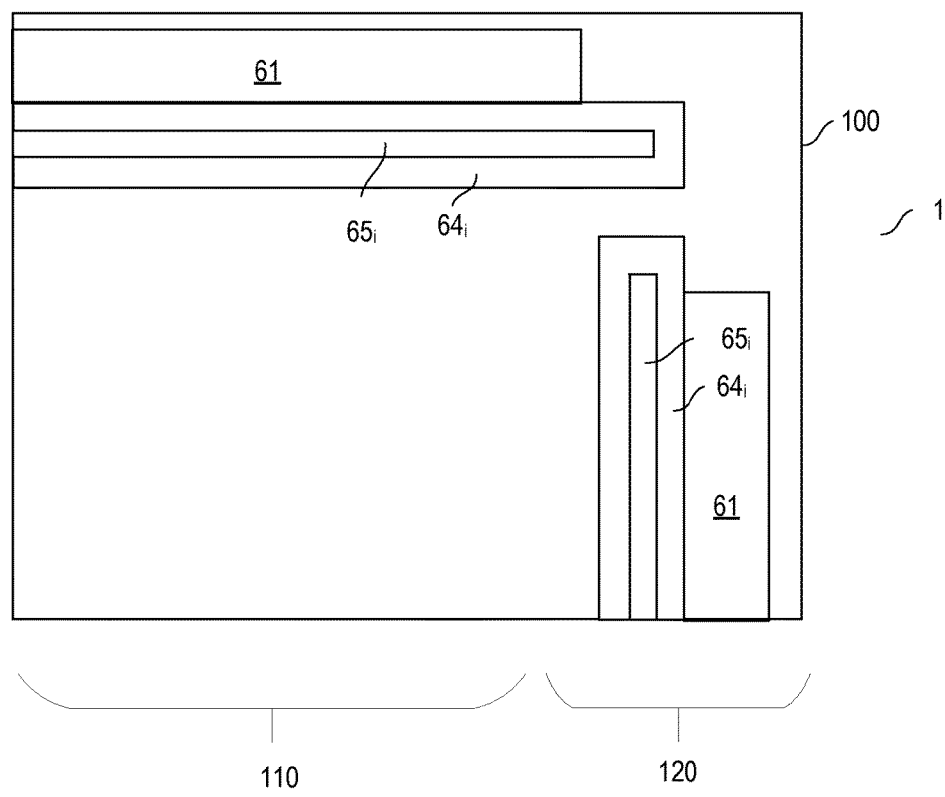
FIG. 14 shows a top view of one section of an outer region according to another embodiment.

Referring to FIG. 13, the diode region 61 may have the form of a ring. This ring may adjoin the elongated trenches (as illustrated). According to another embodiment (not shown), the diode region 61 is spaced apart from the elongated trenches. According to another embodiment shown in FIG. 14, the diode region includes elongated regions which are spaced apart in the corner regions. Those elongated regions may adjoin the trenches (as shown), or be spaced apart from the trenches (not shown).

Referring to FIG. 12, optionally there are doped semiconductor regions $66_1$-$66_4$ of a doping type complementary to the drift region 41 located below the trenches with the field electrodes $65_1$-$65_5$ and the field electrode dielectrics $65_1$-$65_5$. According to one embodiment, a doping concentration of these regions $66_1$-$66_4$ is such that these semiconductor regions $66_1$-$66_4$ in the off-state of the semiconductor device can be depleted completely. According to one embodiment, these semiconductor regions $66_1$-$66_4$ are floating. Although FIG. 12 shows a doped region $66_1$-$66_4$ below each of the trenches this is only an example. According to one embodiment, a doped region corresponding to one of the regions $66_1$-$66_4$ shown in FIG. 12 is located below at least one of the trenches but not below each of the trenches. For example, a doped region is located below a first trench which is located between the inner region 110 and a second trench, and there is no such doped region below the second trench.

In the embodiments explained herein before, the diode region 61 is located in the edge region 120 of the semiconductor device, wherein the edge region 120 surrounds the inner region 110. In the inner region 110 active device regions such as for example, transistor cells are located. The diode region 61, like the inner region may surround the inner region 110 in a ring-shaped fashion. However, this is only an example. According to another embodiment the diode region is implemented in an island-like fashion, so as not to form a ring around the inner region 110. One or more of these island-like diode regions, each connected to the drain node 13, may be provided.

In the embodiments explained herein before, the diode region 61 is arranged in the edge region 120 of the semiconductor body 100 of the first semiconductor device 1. However, referring to the explanation below, implementing the diode region 61 in the edge region 61 is only one example.

Figure 15:
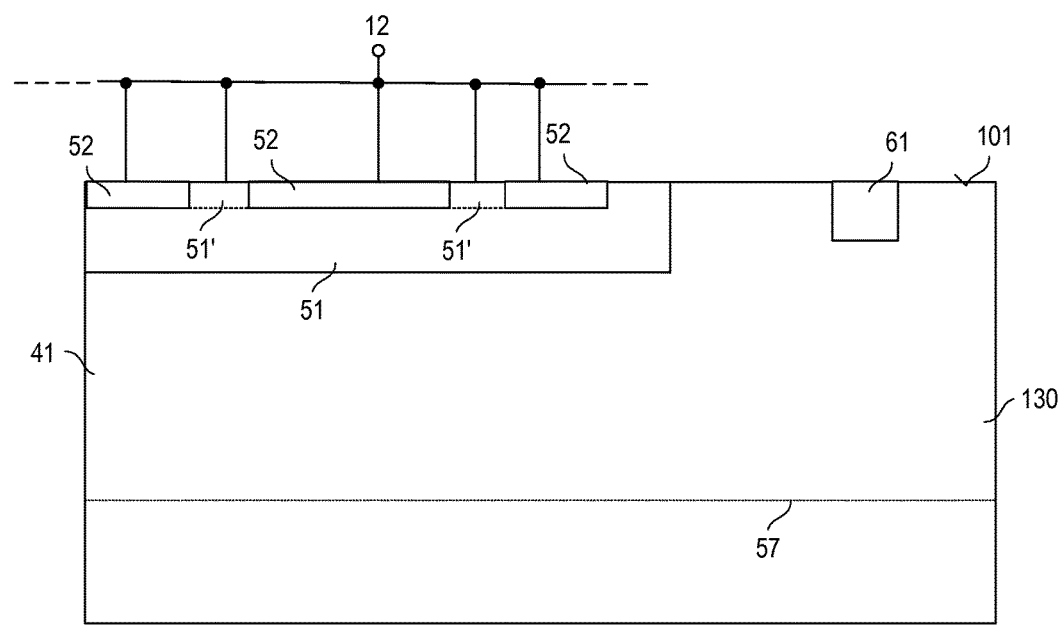
FIG. 15 shows a vertical cross sectional view of a first semiconductor device according to another embodiment.

In a semiconductor device with a topology as shown in FIGS. 11A and 11B, the diode region 61 may be located in the mesa region 130 spaced apart from the body region 51. FIG. 15 shows a vertical cross sectional view of such mesa region 130 in a section plane A-A shown in FIG. 8. This section plane A-A cuts through the mesa region 130 in a longitudinal direction of the mesa region 130. In FIG. 15, reference character 57 denotes the lower end of the field electrode dielectric 57, which corresponds to the lower end of the trenches forming the mesa region 130. As can be seen from FIG. 15, the body region 51 (and the source region 52 arranged in the body region 51) do not extend along the complete length of the mesa region 130. The diode region 61 is located in the mesa region 130 spaced apart from the body region 51 in the lateral direction of the semiconductor body 100 and adjoining the first surface 101. According to one embodiment, there is one body region 51 in each mesa region 130. This body region, as shown in FIG. 15, has a longitudinal end distant to the diode region 61.

Figure 16:
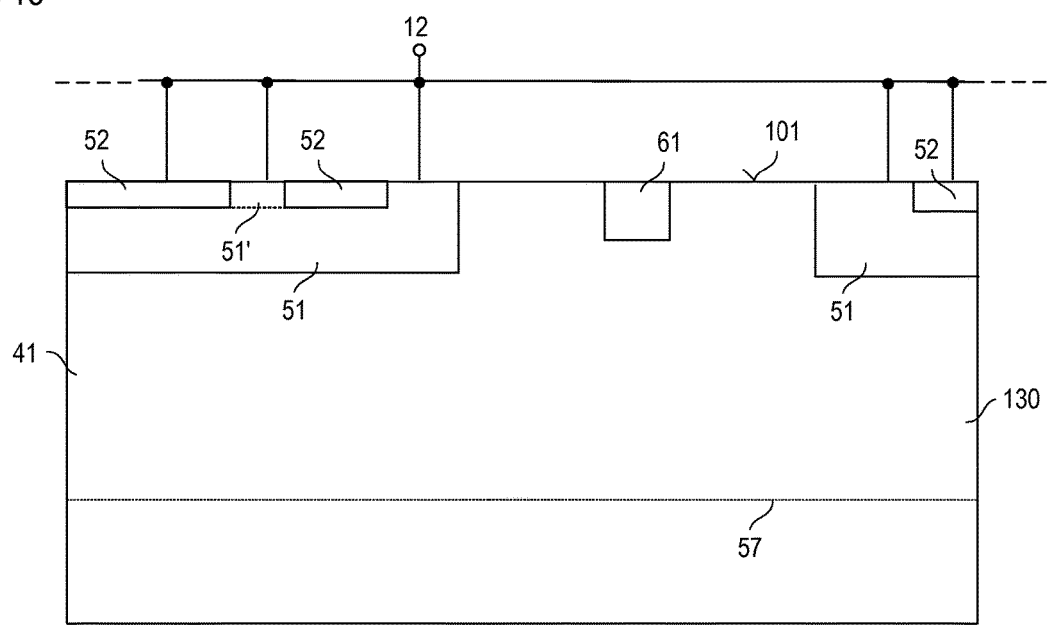
FIG. 16 shows a vertical cross sectional view of a first semiconductor device according to yet another embodiment.

According to another embodiment, shown in FIG. 16, the body region 51 includes at least two body region sections in the mesa region 130. In this embodiment, the diode region 61 is arranged between these two body region sections and spaced apart from each of these body region sections in the lateral direction of the semiconductor body. In each of the embodiments shown in FIGS. 15 and 15, the (shortest) distance between the body region 51 and the diode region is as explained before. That is, the distance is longer than 100% of the (shortest) distance between the body region 52 and the drain region 41.

Referring to FIGS. 15 and 16, the body region 51 or one body region section 51, respectively, may include one source region 52. According to another embodiment (shown in dotted lines in FIGS. 15 and 16), there are several source regions which are spaced apart and each connected to the first load terminal 12. The load terminal 12 may be connected to the body region 51 in sections between the source regions 52. Optionally, there are higher doped body contact regions 51' between the source regions 52, and the first load terminal is connected to those contact regions 51'.

According to one embodiment, the semiconductor device includes a plurality of semiconductor mesa regions, with each mesa region including at least one body region 51 and at least one source region 52 in each body region 51. According to one embodiment, there is a diode region 61 in at least one but less than all of the mesa regions. According to another embodiment, there is a diode region 61 in each of these mesa regions. In case there are two or more diode regions, each of these diode regions 61 is connected to the drain node 13 of the first semiconductor device 1.

Figure 17:
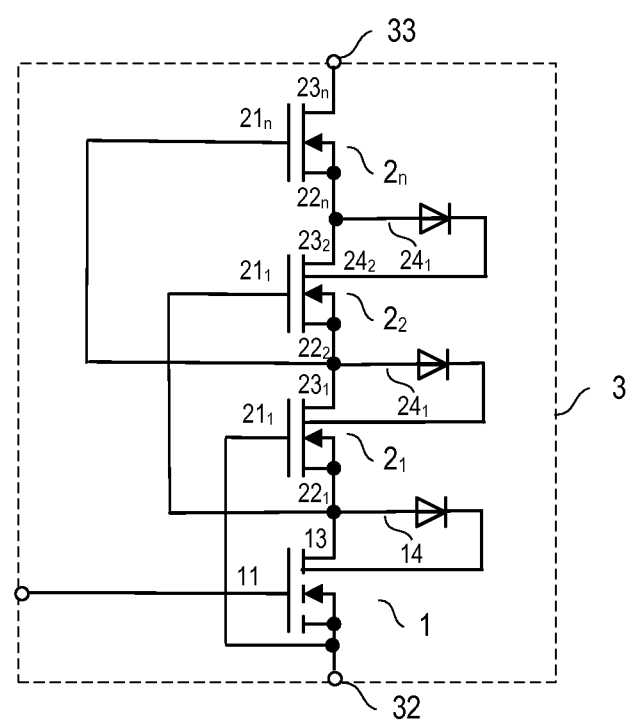
FIG. 17 illustrates a cascode circuit according to another embodiment.

FIG. 17 illustrates a further embodiment of a cascode circuit 3. In this embodiment, the cascode circuit 3 includes one first semiconductor device 1 and several second semiconductor devices $2_1$-$2_n$. Each of these second semiconductor devices $2_1$-$2_n$ includes a control node $21_1$-$21_n$ and a load path between a first load node $22_1$-$22_n$, and a second load node $23_1$-$23_n$. The load paths of the second semiconductor devices $2_1$-$2_n$ are connected in series, and connected in series with a load path of the first semiconductor device 1. This series circuit formed by the load path of the first semiconductor device 1 and the load paths of the second semiconductor devices $2_1$-$2_n$ is connected between the load nodes 32, 33 of the cascode circuit 3. The first semiconductor device 1 is implemented as an n-type transistor device, specifically as an n-type MOSFET, in the embodiment shown in FIG. 14. However, this is only an example, any other type of transistor device may be used as the first semiconductor device 1 as well.

In this embodiment, the second semiconductor device $2_1$ that has its load path directly connected to the load path of the first semiconductor device 1 receives as a drive voltage the load path voltage of the first semiconductor device 1. The second semiconductor device $2_2$ which has its load path directly connected to the load path of the semiconductor device $2_1$ receives as a drive voltage the load path voltage of the second semiconductor device $2_1$, and so on. In the embodiment shown in FIG. 17, there are n=3 second semiconductor devices. However, this is only an example. The number of second semiconductor devices connected in series can be selected arbitrarily. The first semiconductor device 1 and the individual second semiconductor devices $2_1$-$2_n$ may each have a relatively low voltage blocking capability such as, for example, between 10V and 40V. Nevertheless, the cascode circuit 3 may have a relatively high overall voltage blocking capability such as, for example, several 100V by having the plurality of second semiconductor devices $2_1$-$2_n$ connected in series. The overall voltage blocking capability essentially corresponds to the sum of the voltage blocking capabilities of the first and second semiconductor devices 1, $2_1$-$2_n$ connected in series.

The second semiconductor device shown in FIG. 7 as well as each of the second semiconductor devices can be implemented as explained with reference to the first semiconductor device 1 herein before. According to one embodiment, these second semiconductor devices $2_1$-$2_2$ are depletion MOSFETs, in particular, n-type depletion MOSFET.

Referring to FIGS. 7 and 17, the second semiconductor device that has its load path directly connected to the second load node 33 of the cascode circuit 3 (second device 2 shown in FIG. 7, and second device $2_n$ shown in FIG. 17 may or may not be implemented with a diode region. In the latter case, the design of the second device may correspond to that of the first device 1 with the difference that the diode region 61 is to be omitted. In the embodiment shown in FIG. 17, the first semiconductor device 1 and at least the second semiconductor devices $2_1$-$2_3$ are implemented with an internal diode (represented by the diodes 15, $25_1$-$25_3$) so as to be capable of taking over a leakage current without being operated in the avalanche mode.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

The features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor body;
at least one transistor cell comprising a source region, a drift region, a body region separating the source region from the drift region, and a drain region in the semiconductor body, and a gate electrode dielectrically insulated from the body region by a gate dielectric;
a source node connected to the source region and the body region;
a contact node laterally spaced apart from the body region and vertically spaced apart from the drain region and electrically connected to the drain region; and
a rectifier element comprising a first doped region of a doping type complementary to the doping type of the drift region that is formed in a portion of the semiconductor body that is laterally spaced apart from the source and body regions.

2. The semiconductor device of claim 1,
wherein the source region and the drain region are distant in a vertical direction of the semiconductor body, and
wherein the contact node is formed on the first doped region.

3. The semiconductor device of claim 2,
wherein the contact node is connected to the drain region via an edge surface of the semiconductor body.

4. The semiconductor device of claim 1,
wherein the contact node is connected to the drain region via a resistor.

5. The semiconductor device of claim 4,
wherein the resistor is formed on a surface of the semiconductor body.

6. The semiconductor device of claim 1, wherein the contact node is spaced apart from an edge surface of the semiconductor body.

7. The semiconductor device of claim 1, wherein the rectifier device comprises:
a second doped semiconductor region of the same doping type as the drift region and more highly doped than the drift region,
wherein the first doped semiconductor region and the second doped semiconductor region from a pn junction.

8. The semiconductor device of claim 1, further comprising a plurality of transistor cells connected in parallel.

9. An electronic circuit, comprising:
a first semiconductor device comprising a load path between a source node and a drain node, a control node, and an internal rectifier element formed between a contact node and a source node, wherein the contact node is spaced apart from the body region and the drain region in a semiconductor body of the first semiconductor device; and
a second semiconductor device comprising a load path between a drain node and a source node and a control node,
wherein the first semiconductor device and the second semiconductor device have their load paths connected in series, and
wherein the control node of the second semiconductor device is coupled to the source node of the first semiconductor device,
wherein the second semiconductor device further comprises an internal rectifier element comprising a first doped region that is formed in a portion of a semiconductor body of the second semiconductor device that is laterally spaced apart from source and body regions of the second semiconductor device.

10. The electronic circuit of claim 9,
wherein the electronic circuit further comprises a third semiconductor device comprising a load path between a drain node and a source node and a control node,
wherein the second semiconductor device and the third semiconductor device have their load paths connected in series and wherein the control node of the third semiconductor device is coupled to the source node of the second semiconductor device.

11. A semiconductor device, comprising:
a semiconductor body;
at least one transistor cell comprising a source region, a drift region, a body region separating the source region from the drift region, and a drain region in the semiconductor body, and a gate electrode dielectrically insulated from the body region by a gate dielectric;
a source node connected to the source region and the body region;
a drain electrode electrically connected to the drain region;
a contact node spaced apart from the body region and the drain electrode and electrically connected to the drain region; and
a rectifier element formed between the contact node and the source node.

* * * * *